(12) United States Patent
Kim et al.

(10) Patent No.: US 11,906,760 B2
(45) Date of Patent: Feb. 20, 2024

(54) DECORATION MEMBER

(71) Applicant: LG CHEM, LTD., Seoul (KR)

(72) Inventors: Yong Chan Kim, Daejeon (KR); Ki Hwan Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 715 days.

(21) Appl. No.: 17/058,584

(22) PCT Filed: Jun. 17, 2019

(86) PCT No.: PCT/KR2019/007277
§ 371 (c)(1),
(2) Date: Nov. 24, 2020

(87) PCT Pub. No.: WO2019/240560
PCT Pub. Date: Dec. 19, 2019

(65) Prior Publication Data
US 2021/0124099 A1    Apr. 29, 2021

(30) Foreign Application Priority Data

Jun. 15, 2018 (KR) .......................... 10-2018-0069234
Nov. 19, 2018 (KR) .......................... 10-2018-0142874

(51) Int. Cl.
*G02B 5/04* (2006.01)
*C08J 7/04* (2020.01)
(Continued)

(52) U.S. Cl.
CPC .............. *G02B 5/045* (2013.01); *B32B 15/20* (2013.01); *C03C 17/245* (2013.01);
(Continued)

(58) Field of Classification Search
CPC .......... G02B 5/045; G02B 5/003; G02B 5/26; G02B 5/285; B32B 15/20; C03C 17/245; C08J 7/0423; C23C 14/0036
See application file for complete search history.

(56) References Cited

U.S. PATENT DOCUMENTS 5,919,551 A * 7/1999 Cobb, Jr. ............. G02B 5/0231
359/530
6,157,489 A 12/2000 Bradley, Jr. et al.
(Continued)

FOREIGN PATENT DOCUMENTS

CN          1345274 A     4/2002
CN          1630587 A     6/2005
(Continued)

OTHER PUBLICATIONS

Search Report of the Chinese Patent Office from Appl'n. No. 20198003321427, dated Dec. 5, 2022.
(Continued)

*Primary Examiner* — Bao-Luan Q Le
(74) *Attorney, Agent, or Firm* — BRYAN CAVE LEIGHTON PAISNER LLP

(57) ABSTRACT

This specification relates to a decoration member including: a substrate; a pattern layer comprising two or more unit pattern provided on one surface of the substrate; and an inorganic layer formed on the pattern layer, in which the inorganic layer includes a region in which a thickness t(x) of the inorganic layer formed on each unit pattern increases in a direction x in which the unit patterns are arranged.

19 Claims, 16 Drawing Sheets

(51) Int. Cl.

| | | |
|---|---|---|
| *C03C 17/245* | (2006.01) | |
| *G02B 5/00* | (2006.01) | |
| *G02B 5/26* | (2006.01) | |
| *G02B 5/28* | (2006.01) | |
| *B32B 15/20* | (2006.01) | |
| *C23C 14/00* | (2006.01) | |
| *A45D 33/18* | (2006.01) | |
| *A45D 34/00* | (2006.01) | |
| *A45D 40/00* | (2006.01) | |
| *B29C 45/26* | (2006.01) | |
| *B32B 15/082* | (2006.01) | |

(52) U.S. Cl.
CPC ......... *C08J 7/0423* (2020.01); *C23C 14/0036* (2013.01); *G02B 5/003* (2013.01); *G02B 5/26* (2013.01); *G02B 5/285* (2013.01); *A45D 33/18* (2013.01); *A45D 34/00* (2013.01); *A45D 40/00* (2013.01); *A45D 2034/007* (2013.01); *A45D 2040/0012* (2013.01); *B29C 45/26* (2013.01); *B29K 2901/12* (2013.01); *B29K 2995/002* (2013.01); *B32B 15/082* (2013.01); *B32B 2307/4023* (2013.01); *B32B 2307/416* (2013.01); *B32B 2311/04* (2013.01); *B32B 2311/08* (2013.01); *B32B 2311/18* (2013.01); *B32B 2311/22* (2013.01); *B32B 2311/24* (2013.01); *B32B 2439/00* (2013.01); *C03C 2217/72* (2013.01); *C03C 2218/155* (2013.01); *C08J 2367/02* (2013.01)

(56) References Cited

U.S. PATENT DOCUMENTS

| | | | |
|---|---|---|---|
| 6,236,510 B1 | 5/2001 | Bradley, Jr. et al. | |
| 6,602,578 B1 | 8/2003 | Tompkin et al. | |
| 6,686,042 B1 | 2/2004 | LeGallee | |
| 6,797,366 B2 | 9/2004 | Hanson et al. | |
| 7,140,812 B2* | 11/2006 | Bryan | B29C 59/022 |
| | | | 407/119 |
| 7,643,218 B2* | 1/2010 | Wilson | G02B 5/0278 |
| | | | 359/668 |
| 7,652,280 B2* | 1/2010 | Li | B82Y 10/00 |
| | | | 977/762 |
| 7,833,621 B2* | 11/2010 | Jones | G02B 5/124 |
| | | | 428/323 |
| 7,923,122 B2* | 4/2011 | Korechika | G02B 5/09 |
| | | | 428/432 |
| 7,943,206 B2* | 5/2011 | Jones | G02B 1/04 |
| | | | 522/74 |
| 8,113,705 B2* | 2/2012 | Kim | G02B 6/0038 |
| | | | 362/330 |
| 8,525,954 B2* | 9/2013 | Li | H10K 59/32 |
| | | | 349/74 |
| 8,659,221 B2* | 2/2014 | Jones | H10K 50/856 |
| | | | 313/506 |
| 8,854,736 B2* | 10/2014 | Yoshida | G02B 5/26 |
| | | | 359/359 |
| 9,052,601 B2 | 6/2015 | Mikami | |
| 9,799,853 B2* | 10/2017 | Lamansky | G02B 6/0053 |
| 9,818,983 B2* | 11/2017 | Hao | G02B 5/0294 |
| 9,903,989 B2 | 2/2018 | Kim et al. | |
| 10,358,344 B2* | 7/2019 | Lamansky | H10K 50/858 |
| 10,644,267 B2* | 5/2020 | Hao | H10K 50/858 |
| 11,127,927 B2* | 9/2021 | Hao | G02B 5/0294 |
| 11,149,919 B2* | 10/2021 | Vasylyev | G02B 6/001 |
| 2004/0013805 A1 | 1/2004 | Nagata et al. | |
| 2005/0063067 A1 | 3/2005 | Phillips et al. | |
| 2005/0127663 A1 | 6/2005 | Heim | |
| 2008/0206495 A1* | 8/2008 | Korechika | G02B 5/09 |
| | | | 428/30 |
| 2009/0002266 A1* | 1/2009 | Li | H10K 59/32 |
| | | | 345/6 |
| 2009/0255568 A1* | 10/2009 | Morgan | H01L 31/0547 |
| | | | 136/246 |
| 2010/0128204 A1 | 5/2010 | Omote et al. | |
| 2011/0177300 A1 | 7/2011 | Hankey et al. | |
| 2011/0273356 A1 | 11/2011 | Kawaguchi et al. | |
| 2012/0154921 A1* | 6/2012 | Yoshida | B32B 7/12 |
| | | | 359/634 |
| 2013/0022798 A1 | 1/2013 | Fukawa et al. | |
| 2013/0051032 A1* | 2/2013 | Jones | H10K 50/858 |
| | | | 362/326 |
| 2013/0186466 A1* | 7/2013 | Hebrink | C12N 15/113 |
| | | | 428/149 |
| 2013/0251947 A1 | 9/2013 | Lazarev | |
| 2014/0370307 A1* | 12/2014 | Hao | C08L 43/04 |
| | | | 156/60 |
| 2015/0192897 A1 | 7/2015 | Schilling et al. | |
| 2015/0212244 A1 | 7/2015 | Kim et al. | |
| 2016/0052227 A1 | 2/2016 | Takihara et al. | |
| 2017/0052295 A1* | 2/2017 | Sakuma | B32B 27/06 |
| 2017/0307795 A1 | 10/2017 | Hankey et al. | |
| 2018/0033893 A1 | 2/2018 | Lee et al. | |
| 2018/0046017 A1 | 2/2018 | Lee et al. | |
| 2018/0062117 A1* | 3/2018 | Hao | G02B 1/111 |
| 2018/0267638 A1 | 9/2018 | Yoon et al. | |
| 2019/0161847 A1 | 5/2019 | Ready et al. | |
| 2019/0302317 A1 | 10/2019 | Jones et al. | |
| 2020/0062027 A1 | 2/2020 | Shon et al. | |
| 2020/0114621 A1 | 4/2020 | Kim et al. | |
| 2020/0235344 A1* | 7/2020 | Hao | G02B 1/111 |
| 2021/0016540 A1 | 1/2021 | Jo et al. | |

FOREIGN PATENT DOCUMENTS

| | | |
|---|---|---|
| CN | 101249773 A | 8/2008 |
| CN | 102725663 A | 10/2012 |
| CN | 202518003 U | 11/2012 |
| CN | 10245884 A | 12/2014 |
| CN | 104602909 A | 5/2015 |
| CN | 104903117 A | 9/2015 |
| CN | 107112075 A | 8/2017 |
| CN | 107521251 A | 12/2017 |
| CN | 111683562 A | 9/2020 |
| DE | 102016007649 A1 | 12/2017 |
| EP | 2420391 A2 | 2/2012 |
| EP | 3725516 A1 | 10/2020 |
| GB | 1 234 079 A | 3/1971 |
| JP | H03-254943 A | 11/1991 |
| JP | 2002-530712 A | 9/2002 |
| JP | 2005516829 A | 6/2005 |
| JP | 2008-229997 A | 10/2008 |
| JP | 2008-238599 A | 10/2008 |
| JP | 2009-80205 A | 4/2009 |
| JP | 4304001 B2 | 7/2009 |
| JP | 2009168928 A | 7/2009 |
| JP | 2010-173273 A | 8/2010 |
| JP | 2010188713 A | 9/2010 |
| JP | 2011-005682 A | 1/2011 |
| JP | 2011-173379 A | 9/2011 |
| JP | 2011173379 A | 9/2011 |
| JP | 2013-515285 A | 5/2013 |
| JP | 2015-068849 A | 4/2015 |
| JP | 2016218913 A | 12/2016 |
| JP | 2017-205959 A | 11/2017 |
| KR | 10-2008-0078523 A | 8/2008 |
| KR | 10-2010-0135837 A | 12/2010 |
| KR | 10-2014-0008246 A | 1/2014 |
| KR | 10-2014-0029333 A | 3/2014 |
| KR | 10-2016-0085132 A | 7/2016 |
| KR | 1020170133109 A | 12/2017 |
| TW | 201022051 A | 6/2010 |
| TW | 201600901 A | 1/2016 |
| WO | 0031571 A1 | 6/2000 |
| WO | 2000/043565 A1 | 7/2000 |
| WO | 2002/024818 A1 | 3/2002 |
| WO | 2009008403 A1 | 1/2009 |
| WO | 2016159602 A1 | 6/2016 |
| WO | 2016137282 A1 | 9/2016 |
| WO | 2017-214007 A1 | 12/2017 |

(56) References Cited

FOREIGN PATENT DOCUMENTS

| WO | 2018/030355 | A1 | 2/2018 |
| WO | 2018-164464 | A1 | 9/2018 |
| WO | 2019004722 | A1 | 1/2019 |

OTHER PUBLICATIONS

Office Action of Chinese Patent Office in Appl'n. No. 201980032142.7, dated Dec. 9, 2022.
Office Action of Japanese Patent Office in Appl'n No. 2020-562190, dated Dec. 7, 2021.

* cited by examiner

[FIG. 1]
APPLICATION OF ASYMMETRIC PATTERN
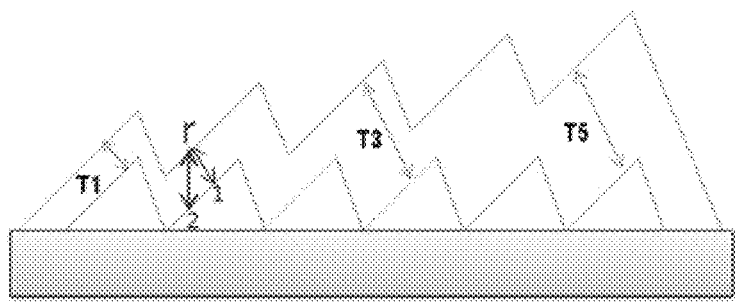
[FIG. 2]
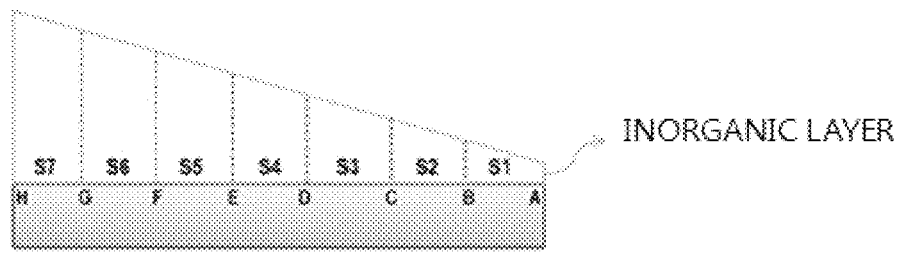

[FIG. 3]
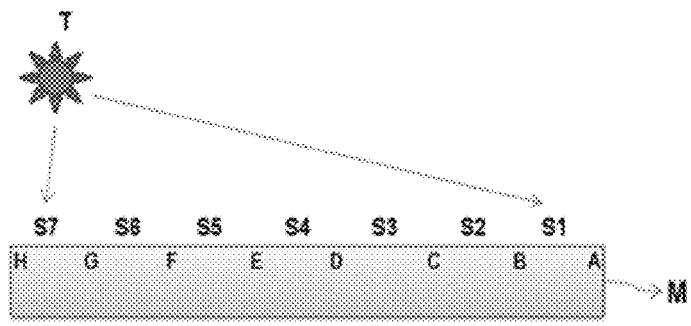
[FIG. 4]
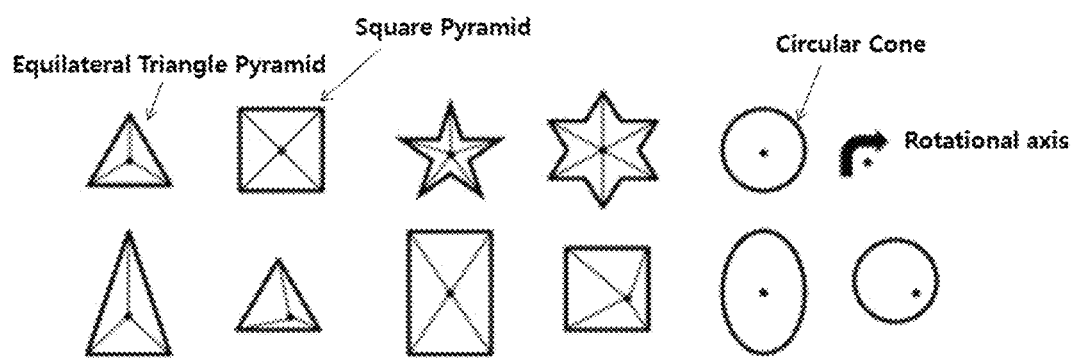
[FIG. 5]
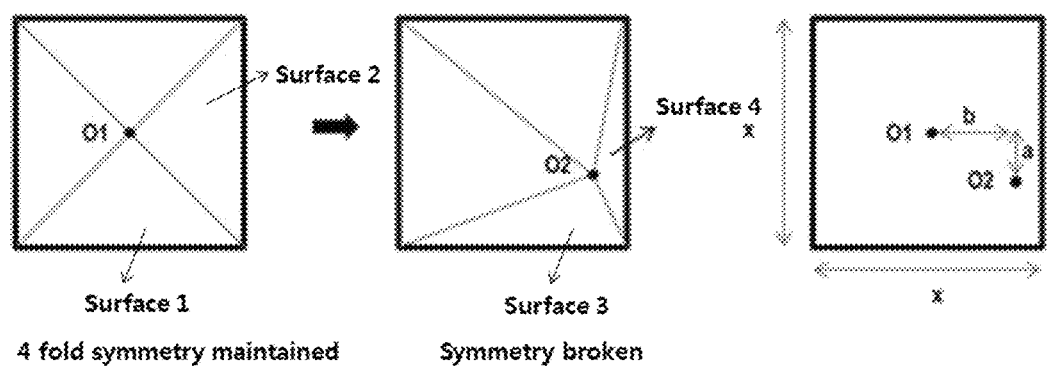

[FIG. 6]
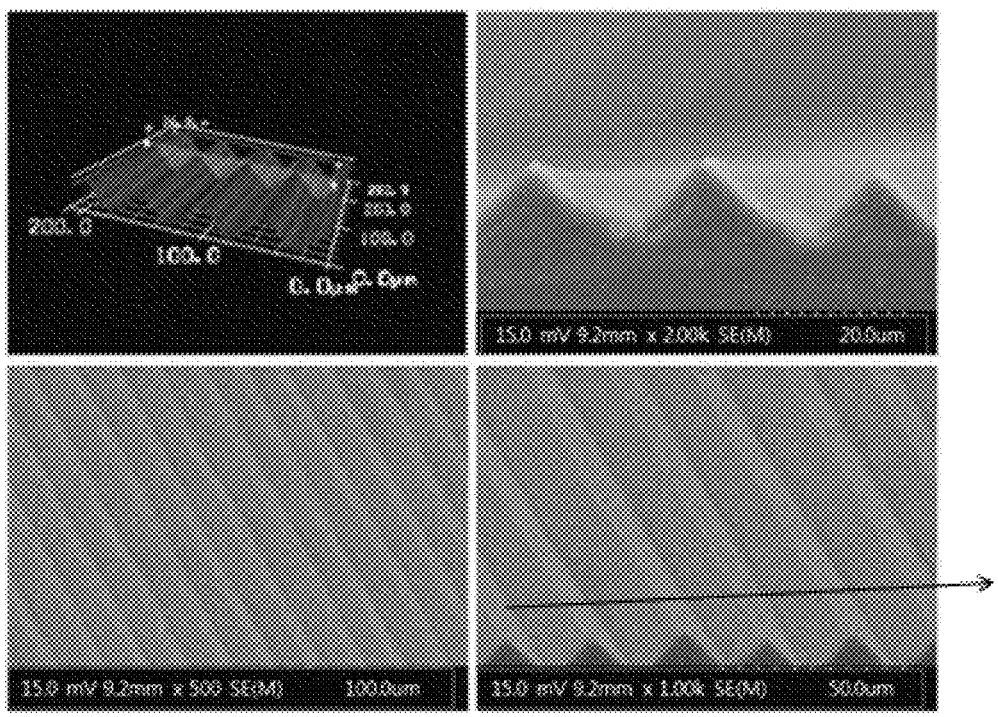
[FIG. 7]
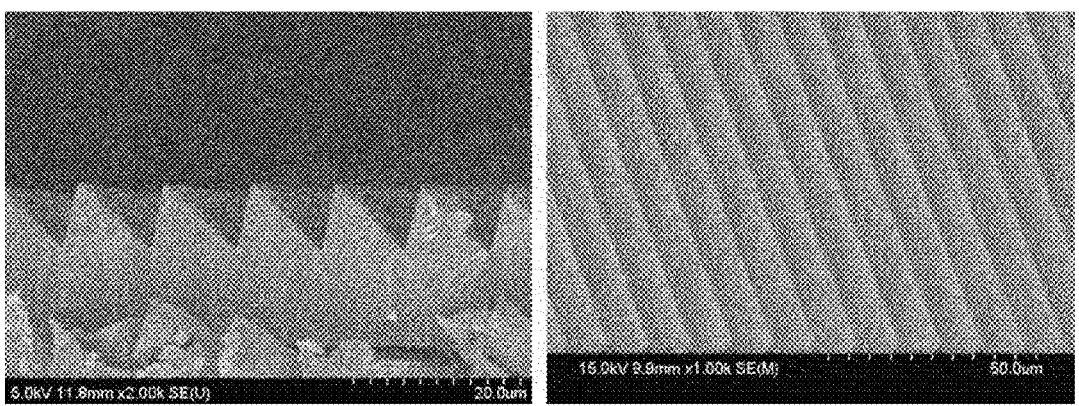

[FIG. 8]
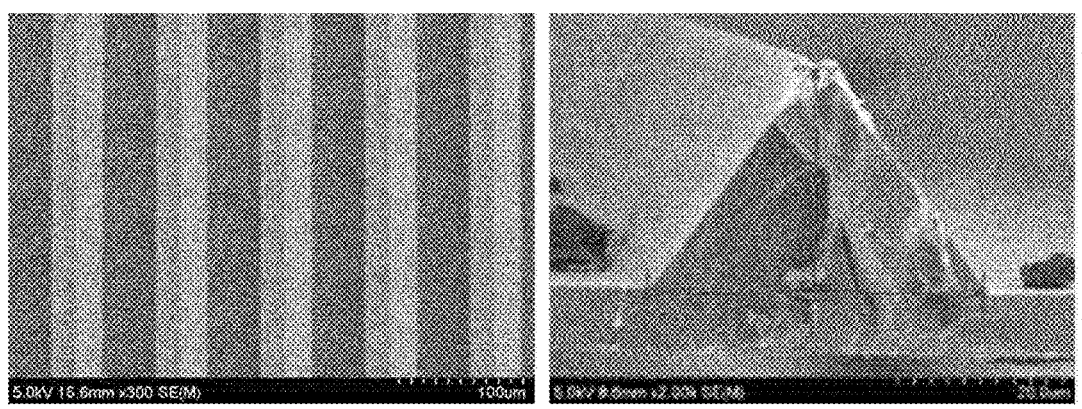

[FIG. 9]
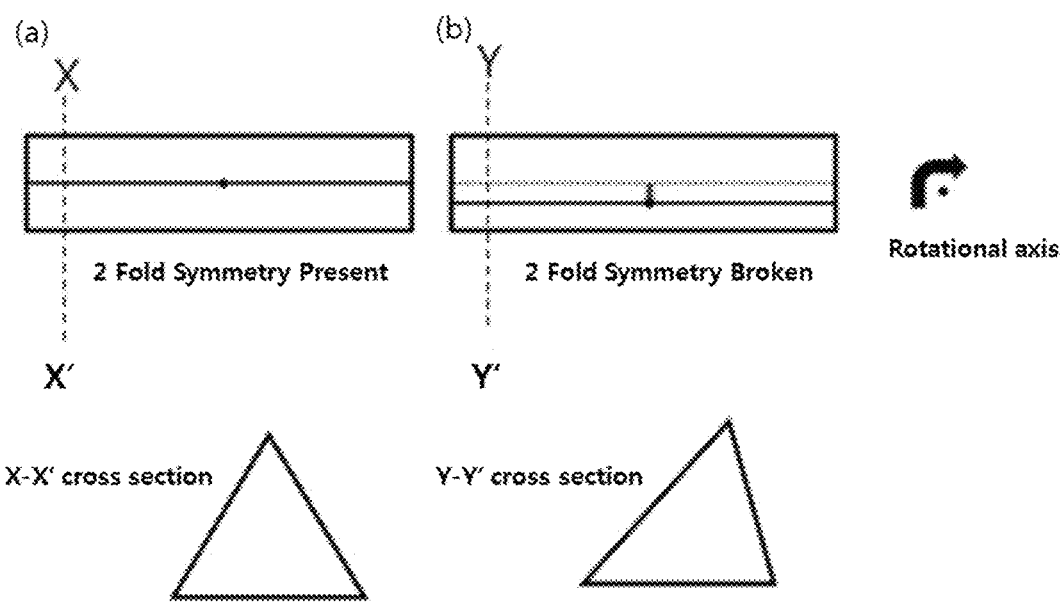
[FIG. 10]
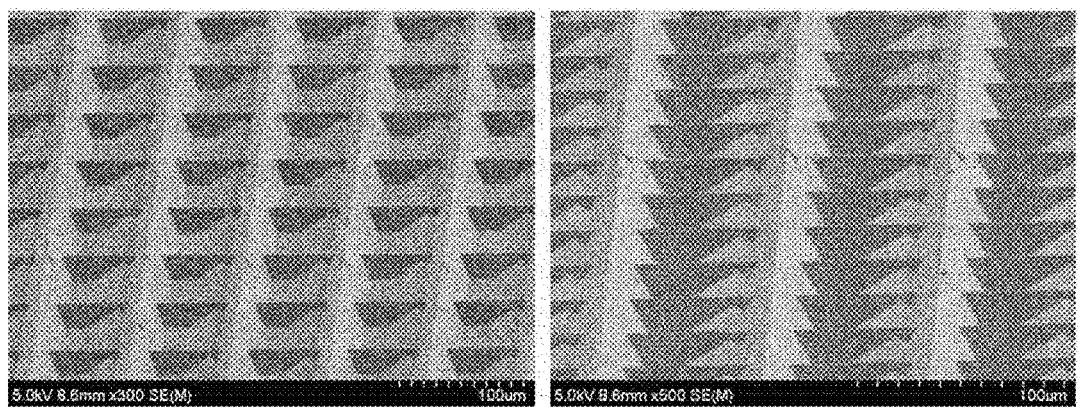

[FIG. 11]
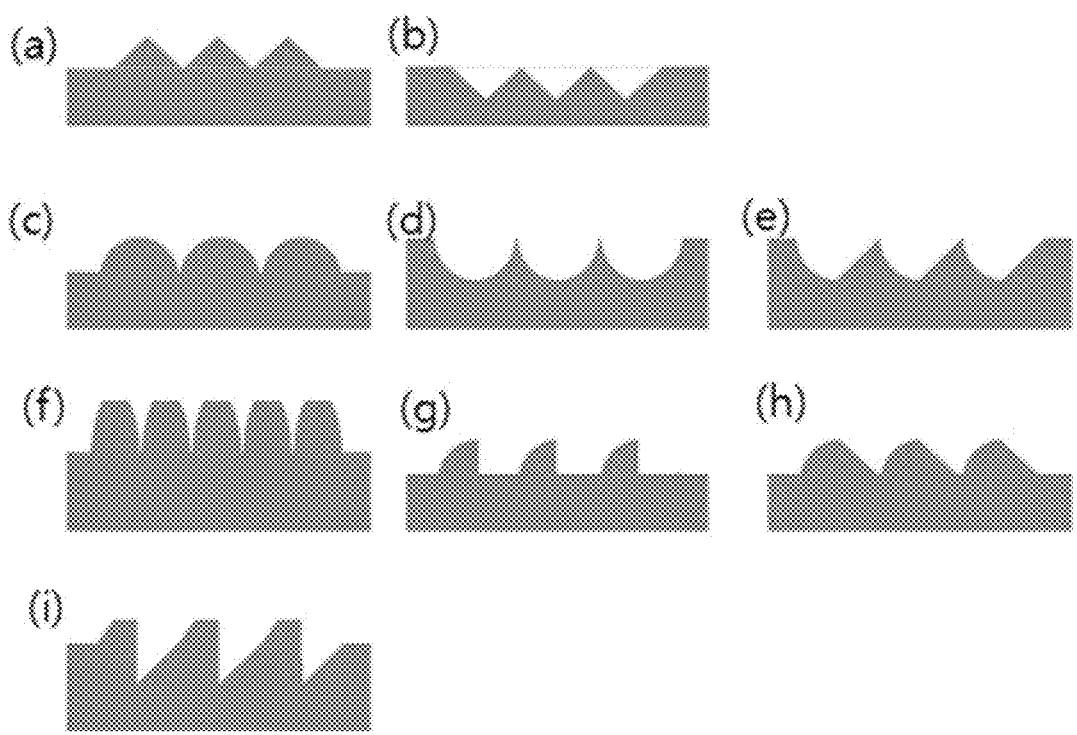

[FIG. 12]
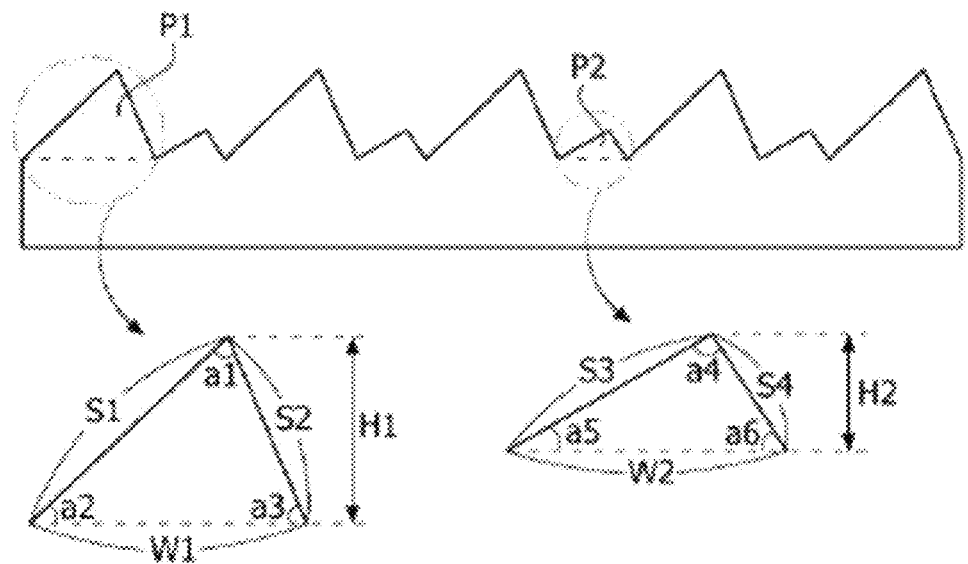
[FIG. 13]
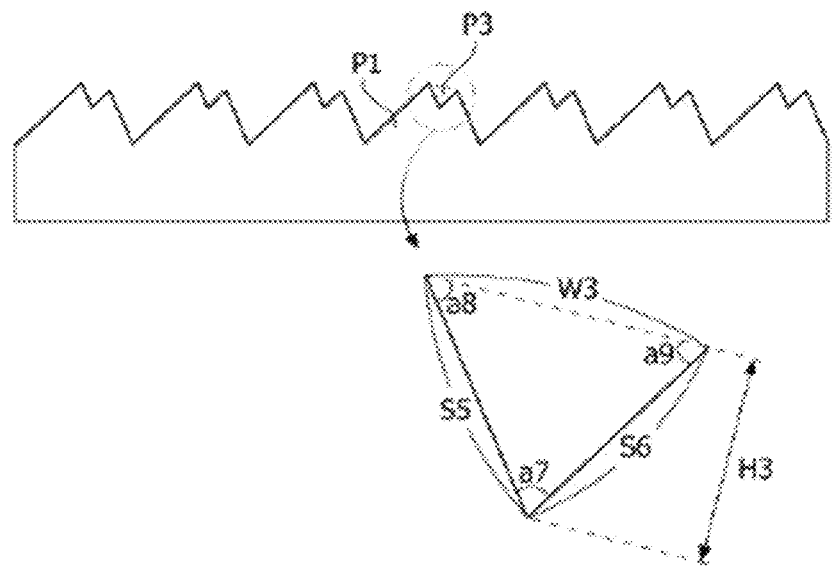

[FIG. 14]
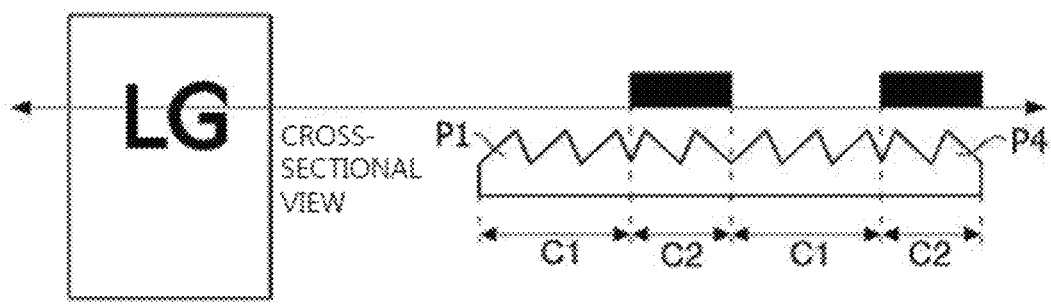
(a)
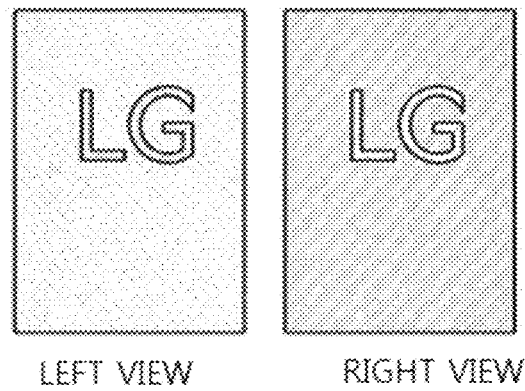
LEFT VIEW    RIGHT VIEW
(b)

[FIG. 15]
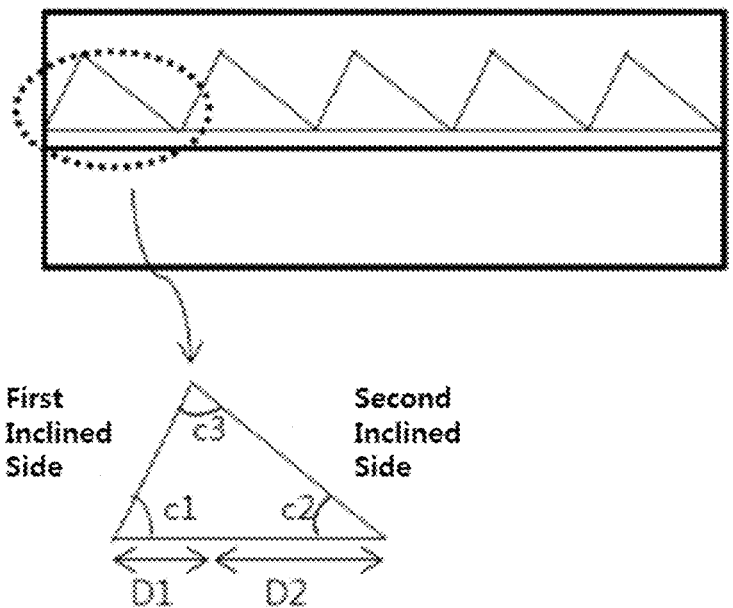
[FIG. 16]
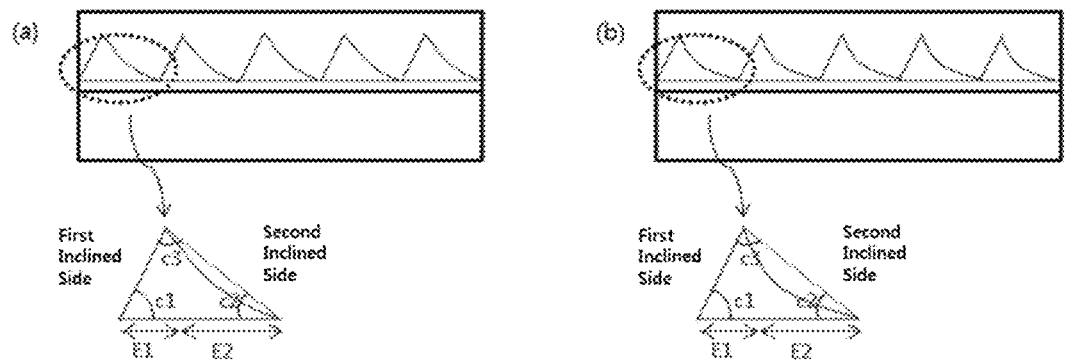

[FIG. 17]
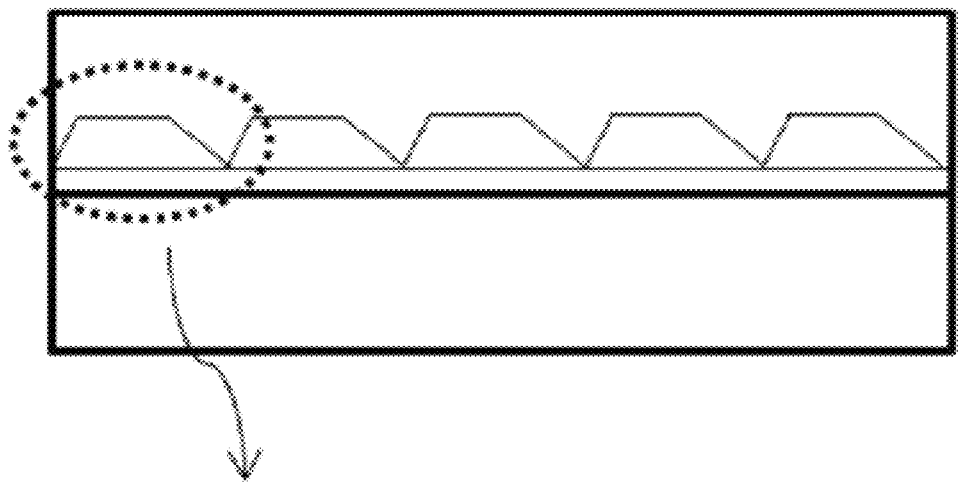
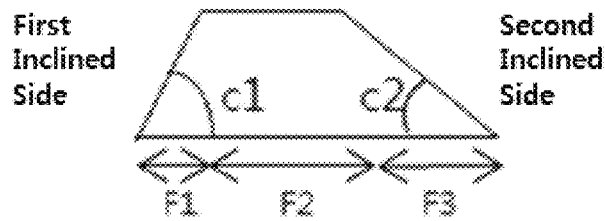
[FIG. 18]
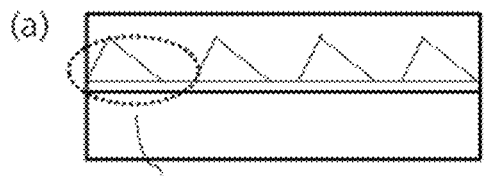
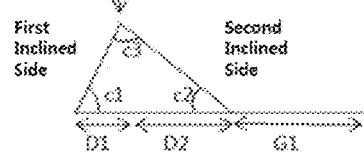
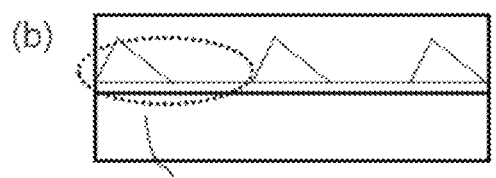
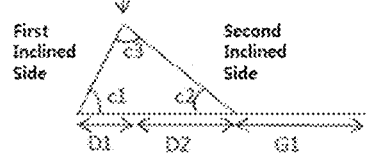

[FIG. 19]
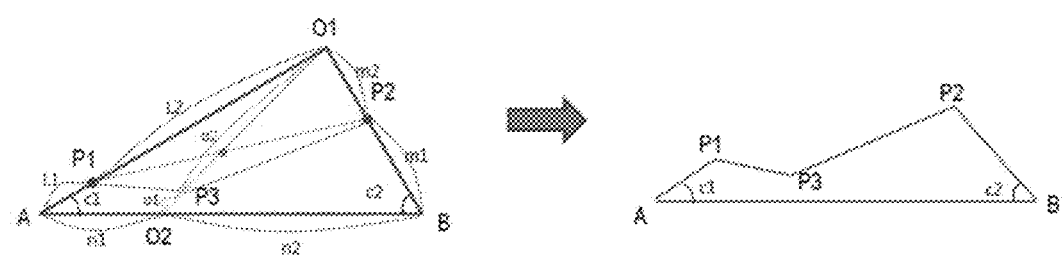
[FIG. 20]

[FIG. 21]
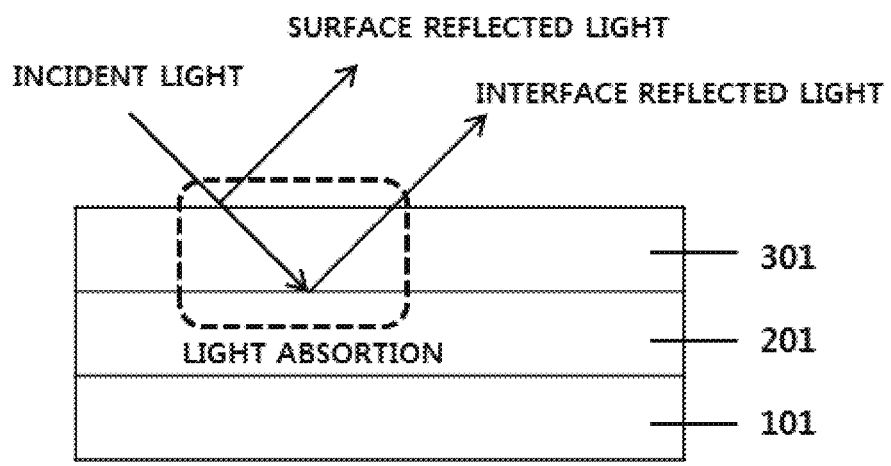
[FIG. 22]
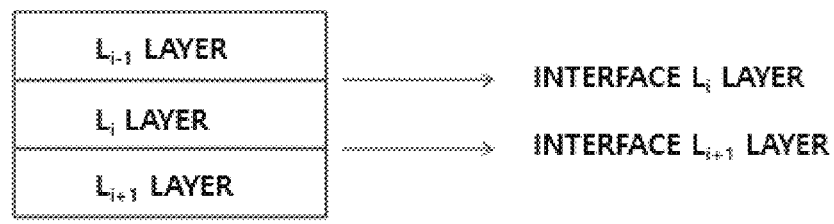

[FIG. 23]
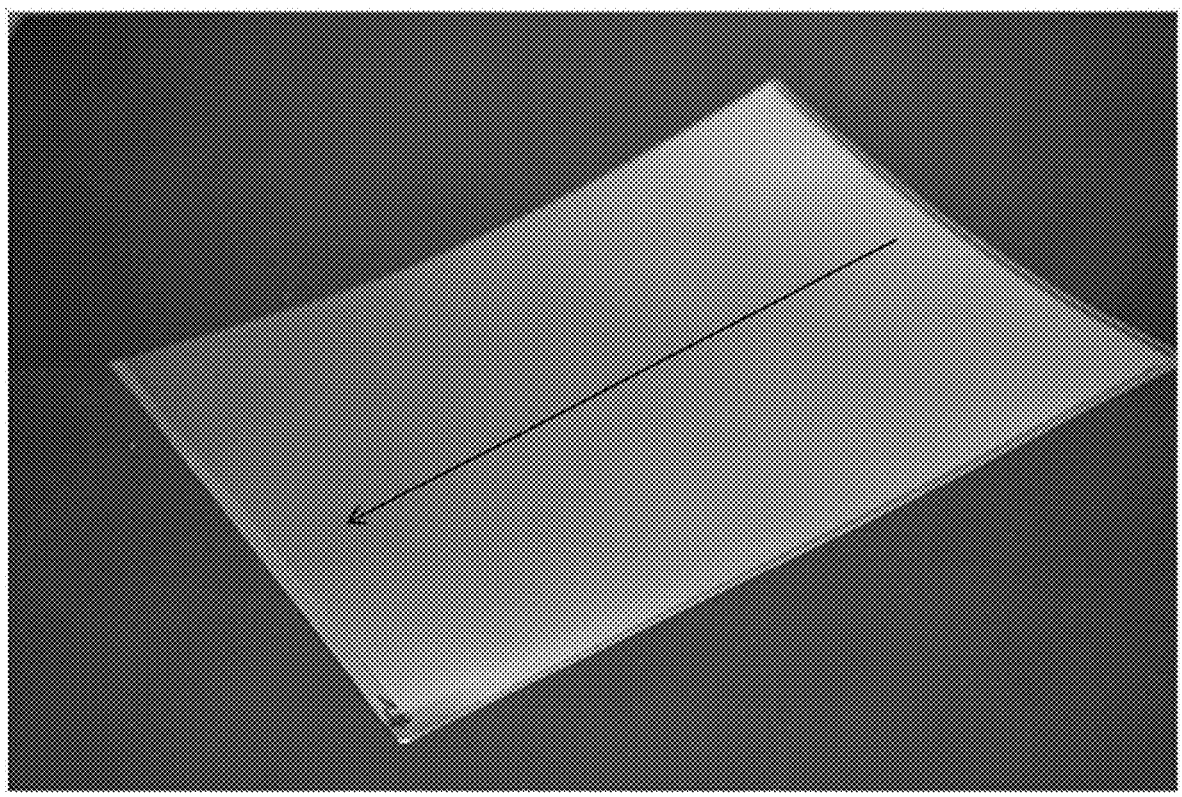

[FIG. 24]
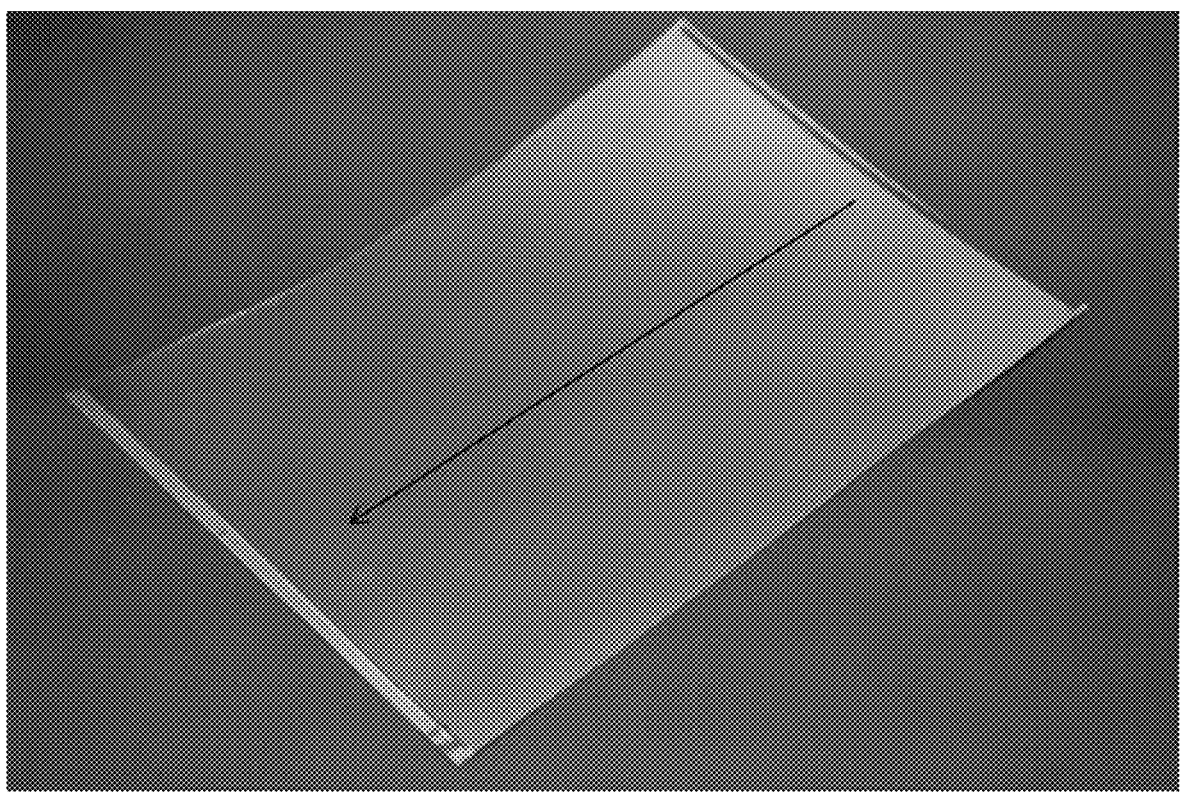

[FIG. 25]
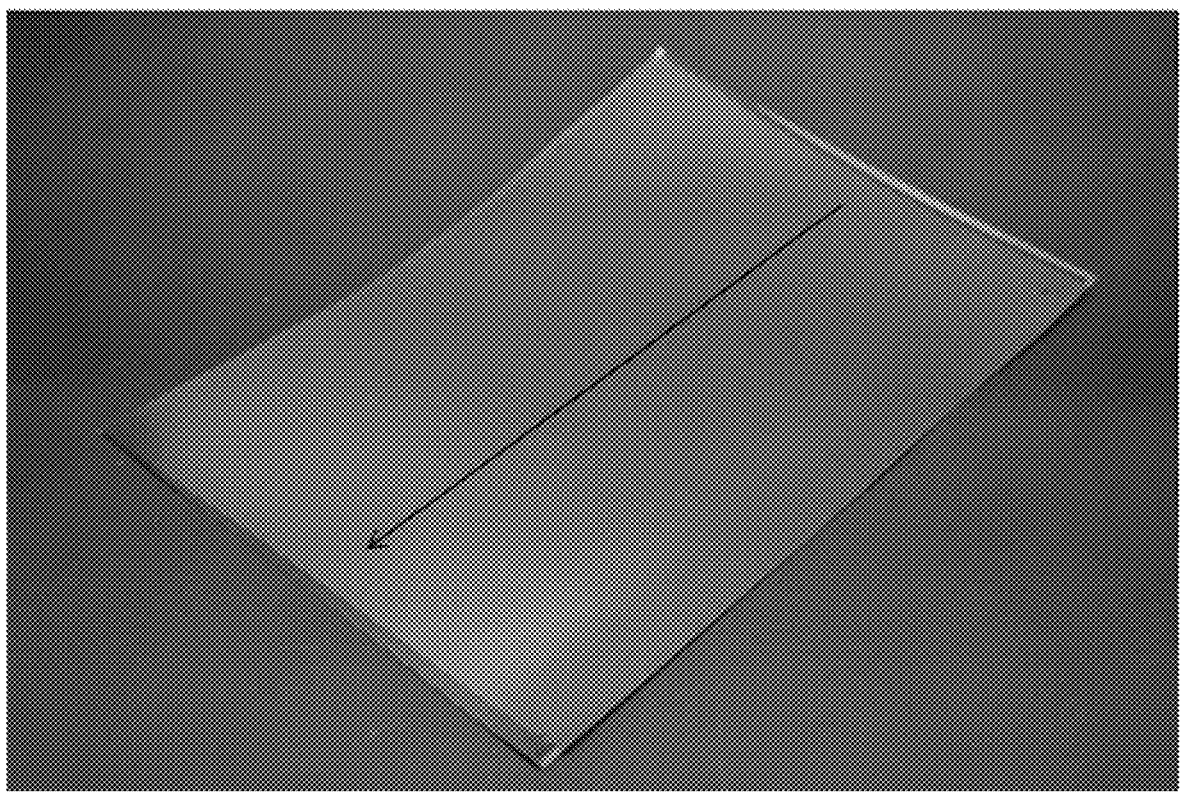

[FIG. 26]
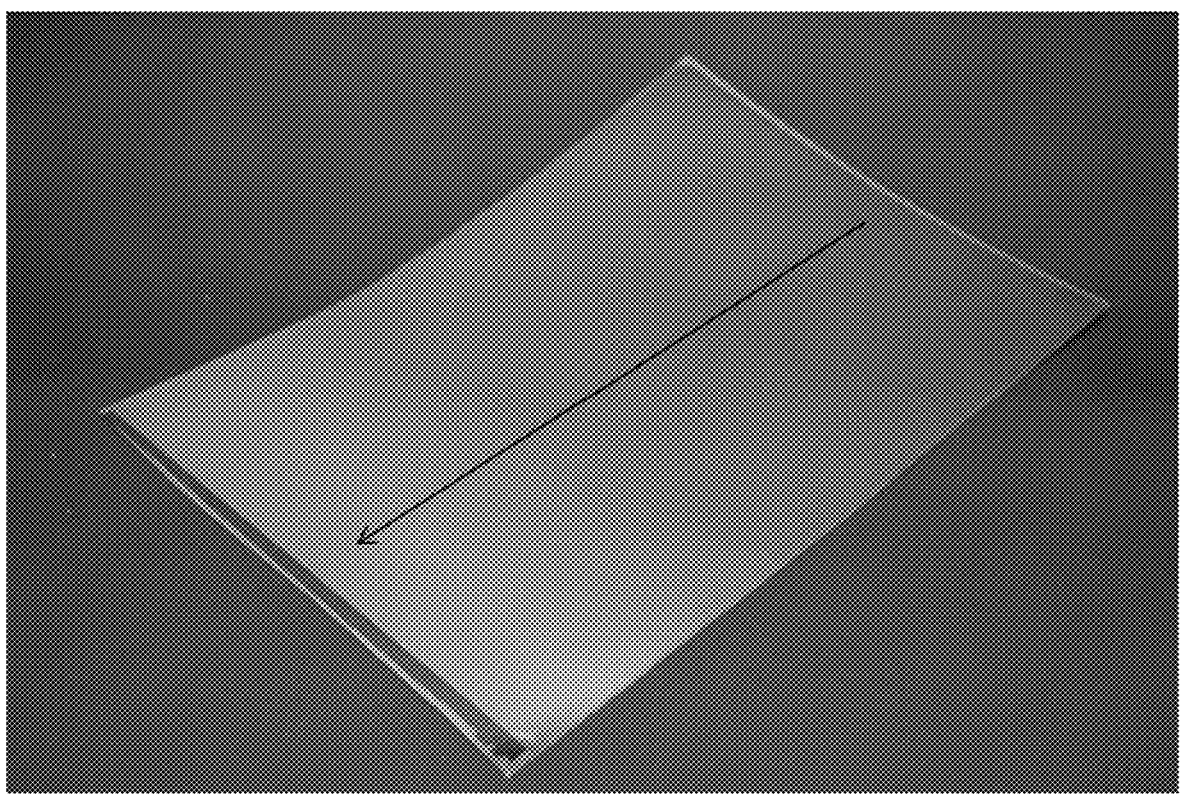

DECORATION MEMBER

The present application is a National Phase entry pursuant to 35 U.S.C. § 371 of International Application No. PCT/KR2019/007277 filed on Jun. 17, 2019, and claims priority to and the benefit of Korean Patent Application No. 10-2018-0069234 filed in the Korean Intellectual Property Office on Jun. 15, 2018 and Korean Patent Application No. 10-2018-0142874 filed in the Korean Intellectual Property Office on Nov. 19, 2018, the entire contents of which are incorporated herein by reference.

FIELD

This specification relates to a decoration member.

BACKGROUND

In cosmetic containers, various mobile devices, and home appliances, a design of a product, for example, a color, a shape, and a pattern plays a big role in adding value of the product to customers in addition to a function of the product. Product preference and price also depend on the design.

As an example, in the case of a cosmetic compact case, various colors and color senses are implemented in various methods and applied to the product. There are methods for giving color to a case material itself and for attaching a decoration film that implements the color and the shape to the case material to give the design.

Expression of the color in the existing decoration film is implemented through a method comprising printing, deposition, and the like. When expressing heterogeneous colors on a single surface, the color should be printed two or more times, and when it is desired to apply a variety of colors to a three-dimensional pattern, it is practically difficult to implement the expression of the colors. Further, in the existing decoration film, the color is fixed according to a viewing angle and even though there is a slight change, the change is limited to a difference degree of the color sensed.

PATENT DOCUMENT

Patent Document 1: Korean Patent Unexamined Publication No. 10-2010-0135837

SUMMARY

This specification has been made in an effort to provide a decoration member.

This specification provides a decoration member comprising a pattern layer comprising two or more unit patterns; and an inorganic layer formed on the pattern layer, wherein the inorganic layer comprises a region in which a thickness t(x) of the inorganic layer formed on each unit pattern increases in a direction x in which the unit patterns are arranged.

According to an embodiment of this specification, in a decoration member, by changing the thickness of the inorganic layer formed on the pattern layer, the color represented by the decoration member has a gradation effect.

In addition, light is absorbed in each of an incident path upon incidence and a reflection path upon reflection when external light is incident through the light absorption layer, and the external light is reflected on the surface of the light absorption layer and the surface of the light reflection layer, respectively, and as a result, constructive and destructive interference phenomena occur between the reflected light on the surface of the light absorption layer and the reflected light on the surface of the light reflection layer. A specific color can be expressed through light absorption and constructive interference and destructive interference phenomena on the incident path and the reflection path. Therefore, a specific color may be implemented according to a reflectance spectrum according to a material of the light reflection layer and a composition of the light absorption layer. Further, since the expressed color is dependent on the thickness, a color may be changed according to the thickness even when the decoration member has the same material composition.

BRIEF DESCRIPTION OF THE DRAWINGS

FIG. 1 illustrates one example of the decoration member according to an embodiment of the present invention.

FIG. 2 is an illustration of a decoration member formed according to another embodiment of the present invention.

FIG. 3 Illustrates controlling a distance between a deposition material and a target according to certain principles of the present invention.

FIG. 4 illustrates various symmetrical and asymmetrical formations that may be used to form the decoration member of the present invention.

FIG. 5 Illustrates various alternative formations that may be used to form the decoration member of the present invention.

FIG. 6 are images of a pattern layer formed according to certain embodiments of the present invention.

FIG. 7 are images of a pattern layer formed according to certain further embodiments of the present invention.

FIG. 8 are images of a pattern layer formed according to certain additional embodiments of the present invention.

FIGS. 9A and 9B are illustrations of patterns that may be used to form decoration member according to the principles of the present invention.

FIG. 10 are images of pattern layers formed according to further aspects of the present invention.

FIGS. 11A-11I are illustrations of various convex or concave shaped formations that can be used to form the decoration member according to certain aspects of the present invention.

FIG. 12 is an illustration of a prism pattern used for forming a decoration member according to certain embodiments of the present invention.

FIG. 13 is an illustration of a prism pattern used for forming a decoration member according to certain alternative embodiments of the present invention.

FIG. 14A is an illustration of a prism pattern used for forming a decoration member according to further embodiments of the present invention, and FIG. 14B illustrates different regions of the decoration member according to further aspects of the present invention.

FIG. 15 is illustration of a cross-section of a pattern layer of decoration member formed according to certain embodiments of the present invention.

FIGS. 16A and 16B are illustrations of formations used the form of decoration member according to alternative embodiments of the present invention.

FIG. 17 an illustration of a cross-section of a pattern layer formed according to certain aspects of the present invention.

FIGS. 18A and 18B are illustrations of a pattern layer formed according to further aspects of the present invention.

FIG. 19 is an illustration of an exemplary pattern layer and manufacturing method of a decoration member formed according to alternative embodiments of the present invention.

FIGS. 20A and 20B are illustrations of alternative pattern layers manufactured by the method illustrated in FIG. 19.

FIG. 21 is a schematic illustration of a decoration member having various layers formed according to the principles of the present invention.

FIG. 22 is a schematic illustration of a decoration member having various layers formed according to an alternative embodiment of the present invention.

FIG. 23 is an illustration of a decoration member according to one embodiment.

FIG. 24 is an illustration of a decoration member according to another embodiment.

FIG. 25 is an illustration of a decoration member according to further embodiment.

FIG. 26 is an illustration of a decoration member according to still another embodiment.

DETAILED DESCRIPTION

Hereinafter, this specification will be described in detail.

In this specification, "or" means "and/or" when "or" selectively comprises them listed or comprises all of them listed, unless otherwise defined.

In this specification, "layer" means covering 70% or more of an area in which the layer exists. Preferably, the "layer" means covering 75% or more and preferably 80% or more.

In this specification, a "thickness" of a layer means a shortest distance from a lower surface to an upper surface of the layer.

In this specification, an "average thickness" means an average value of the thicknesses measured at two or more points of the layer.

In this specification, an "inorganic layer" may impart a metallic texture and a depth effect of color when viewing the decoration member. The inorganic layer may be display various colors according to a viewing angle of an image of the decoration member. This is because a wavelength of light passing through the substrate and reflected from the surface of an inorganic layer is changed according to a wavelength of the incident light.

In this specification, the inorganic layer may have a pattern having the same shape as the pattern layer.

In this specification, each of the light absorption layer and the light reflection layer may be constituted by a single layer or constituted by two layers or more of multiple layers.

FIG. 21 illustrates a lamination structure of a decoration member according to an embodiment of this specification. FIG. 21 illustrates a decoration member which further comprises a substrate 101. In FIG. 21, it is illustrated that the substrate 101 is provided on an opposite surface to a surface facing the light absorption layer 301 of the light reflection layer 201, but the substrate 101 may be provided between the light reflection layer 201 and the light absorption layer 310 or on the opposite surface to the surface facing the light reflection layer 201 of the light absorption layer 301, and the substrate may be omitted.

In this specification, the "convex pattern" may mean a convex shape, and the "concave pattern" may mean a concave shape.

This specification provides a decoration member comprising a pattern layer comprising two or more unit patterns; and an inorganic layer formed on the pattern layer, wherein the inorganic layer comprises a region in which a thickness $t(x)$ of the inorganic layer formed on each unit pattern increases in a direction x in which the unit patterns are arranged. The decoration member has an advantage that the gradation effect according to the interference phenomenon of light may be more variously shown by changing the thickness of the inorganic layer formed on the pattern layer. Further, the color is gradually changed depending on the change in thickness of the inorganic layer and the color is not abruptly changed, and as a result, a person viewing the decoration member may feel a natural color change. FIG. 1 illustrates one example of the decoration member.

In this specification, the "unit pattern" may be a pattern shape having a unit structure, and may be a convex shape or a concave shape of which a cross section has two inclined surfaces. For example, the unit pattern may have a prism shape and the prism-shaped cross section has a triangular shape having two inclined surfaces.

In this specification, the "direction in which the unit patterns are arranged" means a direction in which the unit patterns repeatedly appear. For example, the direction may mean the arrow direction in FIG. 6.

In this specification, the "thickness of the inorganic layer" may mean the shortest distance from any one point of the inorganic layer through which a straight line passes up to a point other than the inorganic layer. For example, the "thickness of the inorganic layer" may mean the shortest distance from any one point r of the inorganic layer of FIG. 1 through which the straight line passes up to a point 1 other than the inorganic layer.

In an embodiment of this specification, the inorganic layer comprises a region in which the thickness $t(x)$ of the inorganic layer formed in each unit pattern increases in the direction x in which the unit patterns are arranged. According to FIG. 1, the thickness of the inorganic layer formed on each unit pattern may be adjusted differently, and the thickness of the inorganic layer formed on the same unit pattern may be the same or different. Referring to FIG. 1, it can be seen that the thickness of the inorganic layer increases in the order of the inorganic layer T1 formed on the first unit pattern on the left side, the inorganic layer T3 formed on the third unit pattern, and the inorganic layer T5 formed on the fifth unit pattern.

Referring to FIG. 2, a gradation inorganic layer may be confirmed in which the thickness of the inorganic layer gradually increases from point A to point H (the pattern layer is omitted).

The thickness of the inorganic layer may be adjusted by changing the deposition rate of the inorganic layer material deposited according to each area. For example, area S1 of FIG. 2 may have a deposition rate of 0% to 10%, and area S7 may have an average deposition rate of 80% to 90%.

The thickness of the area where the thickness $t(x)$ of the inorganic layer increases may be achieved by controlling a distance between a deposition material T and a target M to be deposited. For example, as illustrated in FIG. 3, since area S7 is close to the deposition material, the inorganic layer of area S7 is formed thick and since area S1 is far from the deposition material, the inorganic layer of area S1 is formed thin.

In an embodiment of this specification, the area where the thickness $t(x)$ of the inorganic layer increases comprises at least one of an area where the thickness of the inorganic layer gradually increases, an area where the thickness of the inorganic layer continuously increases, and an area where the thickness of the inorganic layer discontinuously increases.

In this specification, the area where the thickness of the inorganic layer gradually increases means that the cross section in the thickness direction of the inorganic layer comprises a point where the thickness of the inorganic layer is smallest and a point where the thickness of the inorganic layer is largest and the thickness of the inorganic layer increases according to a direction of the point where the thickness of the inorganic layer is smallest to the point where the thickness of the inorganic layer is largest.

The area in which the thickness of the inorganic layer increases continuously means an area comprising only the area in which the thickness increases toward the one direction. The area in which the thickness of the inorganic layer increases discontinuously means an area comprising only the area in which the thickness does not increase toward the one direction.

The area in which the thickness of the inorganic layer increases continuously means an area comprising only the area in which the thickness increases toward the direction x in which the unit patterns are arranged.

The area in which the thickness of the inorganic layer increases discontinuously means an area comprising the area in which the thickness does not increase toward the direction x in which the unit patterns are arranged.

In an embodiment of this specification, the thickness $t(x)$ of the inorganic layer may be 10 nm or more and 300 nm or less, 10 nm or more and 200 nm or less, and preferably 10 nm or more and 150 nm or less. When the numerical range is satisfied, the color appearing depending on the change in thickness of the inorganic layer appears with a gradation effect.

In an embodiment of this specification, a value calculated by Equation A below may be 0.01 or more and 2 or less, preferably 0.05 or more and 1.5 or less, and more preferably 0.1 or more and 1.2 or less.

$$\frac{t1 - t0}{t1} \qquad \text{[Equation A]}$$

In Equation A, $t0$ represents a minimum thickness of a region where the thickness $t(x)$ of the inorganic layer increases and $t1$ represents a maximum thickness of a region where the thickness $t(x)$ of the inorganic layer increases. When the numerical range is satisfied, the color appearing depending on the change in thickness of the inorganic layer appears with a gradation effect.

In an embodiment of this specification, a difference between a minimum thickness $t0$ of the area where the thickness $t(x)$ of the inorganic layer increases and a maximum thickness $t1$ of the area where the thickness $t(x)$ of the inorganic layer increases may be 1 nm or more and 30 nm or less, preferably 1 nm or more and 20 nm or less, and more preferably 5 nm or more and 15 nm or less. When the numerical range is satisfied, the color appearing depending on the change in thickness of the inorganic layer appears with a gradation effect.

In an embodiment of this specification, the unit pattern may comprise a cross section of an asymmetric structure.

In an embodiment of this specification, the unit pattern may comprise a convex or concave pattern having the cross section of the asymmetric structure.

In this specification, the "cross section" means a surface at the time of cutting the asymmetric structure in any one direction. For example, when the decoration member is placed on the ground, the cross section may mean a surface when the asymmetric structure is cut in a direction parallel to the ground or perpendicular to the ground. For example, the cross section in the direction perpendicular to the ground of the prism structure lying on the ground is triangular.

In this specification, the "cross section of the asymmetric structure" means that a figure configured by a periphery of the cross section has a structure which does not have line symmetry or point symmetry.

Line symmetry refers to a case where a property is shown in which when a predetermined figure is made to be symmetric around one straight line, the figure is overlapped. Point symmetry means a case where a symmetrical property is shown in which when a predetermined figure rotates at 180 degrees around one point, the predetermined figure completely overlaps with an original figure. Here, the periphery of the cross section of the asymmetric structure may be the straight line, a curved line, or a combination thereof. For example, the cross section in the direction perpendicular to the ground of the prism structure having a different inclination angle lying on the ground is a triangle having both different inclination angles.

As described above, the decoration member may express dichroism by the convex or concave pattern having the cross section of the asymmetric structure included in the pattern layer. Dichroism means that different colors are observed depending on the viewing angle. The color may be represented by CIE L*a*b* and the color difference may be defined using a distance $\Delta E^*ab$ in the L*a*b* space. Specifically, the color difference is $\Delta E^*ab = \sqrt{\{(\Delta L)^2 + (\Delta a)^2 + (\Delta b)^2\}} > 1$ and an observer may not recognize the color difference within the range of $0 < \Delta E^*ab < 1$ [Reference Document: Machine Graphics and Vision 20 (4):383-411]. Accordingly, in this specification, the dichroism may be defined as $\Delta E^*ab > 1$.

In this specification, the "color difference" refers to a coordinate in the CIE Lab color space, which is a color value defined by the CIE (Commission International de l'Eclairage), and any position in the CIE color space may be expressed by three coordinate values, i.e., L*, a*, b*. The term "color difference" refers to the distance between two colors in the CIE Lab color space. In other words, when the distance is far, the difference in color is great, and when the distance is short, there is little difference in color, which may be expressed as $\Delta E^*$.

Here, the L* value indicates brightness, and when L*=0, black is displayed, and when L*=100, white is displayed. In addition, the a* value indicates whether the color having the color difference is biased to pure magenta or pure green, and the b* value indicates whether the color having the color difference is biased to pure yellow or pure blue.

Specifically, the a* value ranges from −a to +a, the maximum value of a* (a*max) represents pure magenta, and the minimum value of a* (a*min) represents pure green. For example, a negative a* value indicates a pure green biased color and a positive a* value indicates a pure red biased color. Comparing a*=80 and a*=50, a*=80 means being positioned closer to pure red than a*=50. In addition, the b* value ranges from −b to +b. The maximum value of b (b*max) represents pure yellow and the minimum value of b (b*min) represents pure blue. For example, a negative b* value indicates a pure yellow biased color and a positive b* value indicates a pure blue biased color. Comparing b*=50 and b*=20, b*=50 means being positioned closer to pure yellow than b*=20.

In an embodiment of this specification, the pattern layer comprises two or more convex or concave shaped unit patterns. As such, the decoration member comprises two or more convex or concave shaped unit patterns to make dichroism larger. In this case, two or more convex or concave shapes may be a repeated form of the same shape, but may comprise different shapes.

In an embodiment of this specification, the unit pattern comprises two or more sides in which at least one cross section has different inclination angles, different degrees of curvature, or different shapes. For example, when two sides of sides constituting at least one cross section have different inclination angles, different degrees of curvature, or different shapes, the unit pattern has an asymmetrical structure.

In an embodiment of this specification, the cross section of the asymmetric structure comprises a first inclined side and a second inclined side having different inclination angles.

In this specification, the "side" may be a straight line, but is not limited thereto, and all or a part of sides may be curved. For example, the sides may comprise a portion of an arc of a circle or ellipse, a wave structure, a structure such as zigzag, and the like.

In this specification, when the side comprises a portion of an arc of a circle or an ellipse, the circle or ellipse may have a radius of curvature. The radius of curvature may be defined as a radius of the arc when an extremely short section of the curved line is converted into an arc.

In this specification, the term "inclined side" means a side of which an angle between the side and the ground is more than 0 degree and 90 degrees or less when the decoration member is placed on the ground. At this time, when the side is a straight line, the angle between the straight line and the ground may be measured. When the side comprises a curve line, when the decoration member is placed on the ground, an angle between the straight line connecting a point of the side closest to the ground and a point of the surface furthest from the ground at a shortest distance and the ground may be measured.

In this specification, an inclination angle is more than 0 degree and 90 degrees or less as an angle between a surface or side constituting the pattern layer and the ground, when the said decoration member is placed on the ground. Alternatively, the inclination angle may mean an angle formed between the ground and a segment (a'-b') generated when connecting a point a' where the surface or side of the pattern layer is in contact with the ground and a point b' where the surface or side of the pattern layer is furthest from the ground to each other.

In this specification, the degree of curvature refers to a degree of change in a slope of a tangent at successive points on the side or surface. The greater the change in the slope of the tangent at successive points on the side or surface, the greater the degree of curvature.

In an embodiment of this specification, an angle formed between the first inclined side and the second inclined side may be 80 degrees to 100 degrees. The angle formed by the first inclined side and the second inclined side may be, specifically, 80 degrees or more, 83 degrees or more, 86 degrees or more, or 89 degrees or more, and may be 100 degrees or less, 97 degrees or less, 94 degrees or less, or 91 degrees or less. The angle may refer to an angle of a vertex formed between the first inclined side and the second inclined side. When the first inclined side and the second inclined side do not form a vertex with each other, the angle may mean an angle of a vertex in a state in which a vertex is formed by virtually extending the first inclined side and the second inclined side.

In an embodiment of this specification, a difference in inclination angle between the first inclined side and the second inclined side may be 30 degrees to 70 degrees. The difference between the inclination angle of the first inclined side and the inclination angle of the second inclined side may be, for example, 30 degrees or more, 35 degrees or more, 40 degrees or more, or 45 degrees or more, and may be 70 degrees or less, 65 degrees or less, 60 degrees or less or 55 degrees or less. When the difference between the inclination angles of the first inclined side and the second inclined side is within the above range, it may be advantageous in terms of implementation of color representation according to a direction.

In an embodiment of this specification, the convex or concave shape of the surface of the pattern layer may be a cone-shaped convex protruding out of the surface of the pattern layer or a cone-shaped concave recessed inside the surface of the pattern layer.

In an embodiment of this specification, the cone shape comprises a shape of a cone, an elliptical cone, or a polypyramid. Here, the shape of the bottom surface of the polypyramid comprises a triangle, a square, and a star shape having five or more protruding points.

In an embodiment of this specification, when the decoration member is placed on the ground, when the surface of the pattern layer has a cone-shaped convex shape (that is, when the unit pattern has the convex shape), at least one of vertical cross sections of the convex shape with respect to the ground may have a triangular shape. According to another example, when the decoration member is placed on the ground, when the surface of the pattern layer has a cone-shaped concave shape, at least one of vertical cross sections of the concave shape with respect to the ground may have an inverse triangular shape.

In an embodiment of this specification, the cone-shaped convex or the cone-shaped concave shape may have at least one cross section of an asymmetric structure. For example, when the cone-shaped convex or concave is observed from the surface side of the convex or the concave shape, when two or less identical forms exist when rotating 360 degrees from the vertex of the cone, it is advantageous in expressing the dichroism. FIG. 4 shows the cone-shaped convex shape observed from the surface side of the convex shape, including cone shapes having a symmetrical structure, and cone shapes of an asymmetric structure.

When the decoration member is placed on the ground, the cone shape of the symmetrical structure has a regular polygon of which a cross section (hereinafter, referred to as a horizontal cross section) in a direction horizontal to the ground is a circle or a regular polygon of which a length of each side is the same and is a structure in which the vertex of the cone exists on a line perpendicular to the cross section of the center of gravity of the horizontal cross section for the ground. However, when viewed from the surface side of the cone-shaped convex or concave shape, a cone shape having a cross section of an asymmetric structure is a structure in which a position of the vertex of the cone exists on the vertical line of the point that is not the center of gravity of the horizontal cross section of the cone or a structure in which a horizontal cross section of the cone is a polygon or ellipse of an asymmetric structure. When the horizontal cross section of the cone is a polygon of an asymmetric structure, at least one of sides or angles of the polygon may be designed differently from other sides or angles.

For example, as shown in FIG. 5, the position of the vertex of the cone may be changed. Specifically, as shown in the first picture of FIG. 5, when the vertex of the cone is designed to be located on the vertical line of the center 01 of gravity of the horizontal cross section with respect to the ground of the cone when observed from the surface side of the con-shaped convex shape, four identical structures may be obtained when rotating at 360 degrees based on the vertex of the cone (4 fold symmetry). However, the symmetrical structure is broken by designing the vertices of the cone at a position 02 other than the center 01 of gravity of the horizontal cross section with respect to the ground. When a length of one side of the horizontal cross section with respect to the ground is x, moving distances of vertexes of the cone are a and b, a height of the cone shape which is a length of the line connected vertically from the vertex 01 or 02 of the cone to the horizontal cross section with respect to the ground is h, and an angle formed between the horizontal cross section and the side surface of the cone is θn, a cosine value may be obtained as described below with respect to surfaces 1, 2, 3 and 4 of FIG. 5.

$$\cos(\Theta 1) = \frac{\left(\frac{x}{2}\right)}{sqrt\left(h^2 + \left(\frac{x}{2}\right)^2\right)} \quad \cos(\Theta 3) = \frac{\left(\frac{x}{2} - a\right)}{sqrt\left(h^2 + \left(\frac{x}{2} - a\right)^2\right)}$$

$$\cos(\Theta 2) = \frac{\left(\frac{x}{2}\right)}{sqrt\left(h^2 + \left(\frac{x}{2}\right)^2\right)} \quad \cos(\Theta 4) = \frac{\left(\frac{x}{2} - b\right)}{sqrt\left(h^2 + \left(\frac{x}{2} - b\right)^2\right)}$$

At this time, since θ1 and θ2 are the same, there is no dichroism. However, since θ3 and θ4 are different from each other, and |θ3−θ4| means a color difference ΔE*ab between two colors, dichroism may be exhibited. Here, |θ3−θ4|>0. As such, by using the angle between the horizontal cross section and the side surface of the ground of the cone, it is possible to quantitatively indicate how much the symmetrical structure is broken, that is, the degree of asymmetry, and the numerical value representing the degree of asymmetry is proportional to the color difference of the dichroism.

According to yet another example, the pattern layer has a surface of which the highest point is a linear convex shape or the lowest point is a linear concave shape. FIGS. 6 to 8 illustrate photographs of an example in which a convex having a linear shape is implemented. The linear shape may be a straight line shape, and a curved line shape, may comprise both a curved line and a straight line, or may be a zigzag shape. When the surface of which the highest point is a linear convex shape or the lowest point is a linear concave shape is viewed from the surface side of the convex or concave shape, it is advantageous in expressing dichroism when there is only one identical form when rotating 360 degrees based on the center of gravity of the horizontal cross section with respect to the ground of the convex or the concave. FIGS. 9(a) and 9(b) show a surface of which the highest point has a linear convex shape, in which 9(a) illustrates a pattern having convexes that do not express dichroism, and 9(b) shows a pattern having convexes expressing dichroism. A cross section X-X' of FIG. 9(a) is an isosceles triangle or an equilateral triangle, and a cross section Y-Y' of FIG. 9(b) is a triangle having different side lengths.

According to yet another example, the pattern layer has a convex or concave-shaped surface of a structure in which the tip of the cone shape is cut off. FIG. 10 illustrates a photograph embodying an inverted trapezoidal concave with an asymmetrical cross section perpendicular to the ground when the decoration member is placed on the ground. Such an asymmetric cross section may be a trapezoidal or inverted trapezoidal shape. Even in this case, dichroism may be expressed by the cross section of an asymmetric structure.

In addition to the structure illustrated above, various convex or concave-shaped surfaces as shown in FIGS. 11(a)-11(i) may be implemented.

In an embodiment of this specification, the shape of the convex or the concave comprises a first inclined side and a second inclined side of which inclination angles are different from each other.

In this specification, the "surface" may be a flat surface, but is not limited thereto, and all or a part of sides may be a curved surface. For example, a shape of the cross section in the vertical direction to the surface may comprise structures comprising a part of an arc of a circle or ellipse, a wave structure, a zigzag, and the like.

In this specification, the term "inclined surface" means a surface of which an angle between the surface and the ground is more than 0 degree and 90 degrees or less when the decoration member is placed on the ground. At this time, when the surface is the plane, the angle between the plane and the ground may be measured. When the surface comprises a curved surface, when the decoration member is placed on the ground, an angle between the straight line linking a point of the surface closest to the ground and a point of the surface furthest from the ground at a shortest distance and the ground may be measured.

FIGS. 12 to 14 exemplarily illustrate a decoration member comprising a pattern layer and an inorganic layer (not shown) each comprising a surface having a convex P1 shape. Each of FIGS. 12 to 14 illustrate a surface when the pattern layer is cut in a direction perpendicular to the surface of the pattern layer comprising two or more unit patterns. Therefore, when the figure is expanded in the direction perpendicular to the ground of the drawings of FIGS. 12 to 14, the convex shape of the pattern layer appears. For example, in FIG. 12, prism patterns having different heights are alternately arranged.

In this specification, inclination angles a2 and a3 of the convex P1 may mean angles formed by inclined surfaces S1 and S2 of the convex P1 and a horizontal surface of the pattern layer. Unless particularly mentioned in this specification, the first inclined surface in the drawing may be defined as the left inclined surface of the convex and the second inclined surface may mean the right inclined surface of the convex.

The convex P1 of the pattern layer may have a columnar shape having a cross section having a polygonal shape and extending in one direction. In one example, the cross section of the convex P1 may be a triangle or have a shape further comprising a small concave at a tip (a pointed portion or a vertex portion) of the triangle.

In an embodiment of this specification, the height of the convex may be 5 µm to 30 µm. If the height of the convex is within the above range, it may be advantageous in terms of production process. In this specification, the height of the convex may mean the shortest distance between the highest portion and the lowest portion of the convex with respect to a horizontal plane of the pattern layer. In the description relating to the height of the convex, the same numerical range may be applied even to the depth of the concave.

In an embodiment of this specification, the width of the convex may be 10 µm to 90 µm. If the width of the convex is within the above range, it may be advantageous in terms of process for processing and forming the pattern. The width of the convex may be 10 µm or more, 15 µm or more, 20 µm or more, or 25 µm or more, 90 µm or less, 80 µm or less, 70 µm or less, 60 µm or less, 50 µm or less, 40 µm or less, or 35 μm or less. Descriptions relating to this width may apply not only to the convexes, but also to the concaves.

In an embodiment of this specification, an interval between the convexes may be 0 μm to 20 μm. In this specification, the interval between the convexes may mean the shortest distance between an end point of one convex and a start point of the other convex of two adjacent convexes. If the interval between the convexes is properly maintained, the decoration member should have a relatively bright color when viewed from an inclined surface having a larger inclination angle of the convex, and a phenomenon that the reflection area is dark due to shading may be improved. As described later, a second convex having a smaller height than the convex may exist between the convexes. Descriptions relating to this interval may apply not only to the convexes, but also to the concaves described above.

In an embodiment of this specification, the pattern layer comprises the convex or concave having different sizes.

In an embodiment of this specification, the pattern layer comprises two or more first convexes and second convexes disposed between the first convexes and having a smaller height than the first convexes. FIG. 12 exemplarily illustrates a decoration member in this specification. According to FIG. 12, the surface of the pattern layer may have a shape in which a second convex P2 which is smaller in height than the convex is disposed between the convexes P1. Hereinafter, the convex described before the second convex may be called the first convex.

In an embodiment of this specification, a height H2 of the second convex P2 may have a range of ⅕ to ¼ of the height H1 of the first convex P1. For example, a difference (H1−H2) between the heights of the first convex and the second convex may be 10 μm to 30 μm. The width W2 of the second convex may be 1 μm to 10 μm. The width W2 of the second convex may be specifically 1 μm or more, 2 μm or more, 3 μm or more, 4 μm or more, or 4.5 μm or more, and may be 10 μm or less, 9 μm or less, 8 μm or less, 7 μm or less, 6 μm or less, or 5.5 μm or less.

In an embodiment of this specification, the second convex may have two inclined surfaces S3 and S4 having different inclination angles. An angle a4 formed between the two inclined surfaces of the second convex may be 20 degrees to 100 degrees. Specifically, the angle a4 may be 20 degrees or more, 30 degrees or more, 40 degrees or more, 50 degrees or more, 60 degrees or more, 70 degrees or more, 80 degrees or more, or 85 degrees or more, and may be 100 degrees or less or 95 degrees or less. A difference (a6−a5) between the inclination angles of both inclined surfaces of the second convex may be 0 to 60 degrees. The difference (a6−a5) of the inclination angle may be 0 degrees or more, 10 degrees or more, 20 degrees or more, 30 degrees or more, 40 degrees or more, or 45 degrees or more, and may be 60 degrees or less or 55 degrees or less. When the dimension of the second convex is within the above range, it may be advantageous in that the inflow of light is increased on the side surface having a large inclination angle to form a bright color.

In an embodiment of this specification, the pattern layer comprises a convex and a concave formed on the convex. FIG. 13 exemplarily illustrates a decoration member. According to FIG. 13, the surface of the pattern layer may have a shape in which a tip portion (pointed portion) of the convex P1 further comprises a concave P3 smaller in height than the convex. The decoration member may show an effect that an image color is slightly changed depending on the viewing angle.

In an embodiment of this specification, the height H3 of the concave P3 may be 3 μm to 15 μm. The height H3 of the concave P3 may be specifically 3 μm or more, and may be 15 μm or less, 10 μm or less, or 5 μm or less. The concave may have two inclined surfaces S5 and S6 having different inclination angles. An angle a7 formed between the two inclined surfaces of the concave may be 20 degrees to 100 degrees. Specifically, the angle a7 may be 20 degrees or more, 30 degrees or more, 40 degrees or more, 50 degrees or more, 60 degrees or more, 70 degrees or more, 80 degrees or more, or 85 degrees or more, and may be 100 degrees or less or 95 degrees or less. A difference (a9−a8) between the inclination angles of both inclined surfaces of the concave may be 0 to 60 degrees. The difference (a9−a8) of the inclination angle may be 0 degrees or more, 10 degrees or more, 20 degrees or more, 30 degrees or more, 40 degrees or more, or 45 degrees or more, and may be 60 degrees or less or 55 degrees or less. When the dimension of the concave is in the above range, it may be advantageous in terms of adding color in a mirror surface.

In an embodiment of this specification, the pattern layer comprises two or more convexes arranged in an inverted structure of 180 degrees. FIGS. 14(a) and 14(b) exemplarily illustrate a decoration member. According to FIG. 14(a), the surface of the pattern layer may have a shape in which a plurality of convexes is arranged in the inverted structure at 180 degrees. Specifically, the surface of the pattern layer may comprise a first region C1 in which the second inclined surface has a larger inclination angle than the first inclined surface and a second region C2 in which the second inclined surface has a larger inclination angle than the first inclined surface. In one example, the convex included in the first region may be referred to as the first convex P1 and the convex included in the second region may be referred to as a fourth convex P4. The contents described in the items of the convex P1 may be similarly applied to the height, the width, and the inclination angles of the first and fourth convexes P1 and P4 and the angle formed by the first and second inclined surfaces. As illustrated in FIG. 14(b), one of the first region and the second region may correspond to an image or a logo, and the other region may correspond to a background part. The decoration member may show an effect that the color of the image or log is slightly changed depending on the viewing angle. Further, the decoration member may show a decoration effect that the colors of the image or log part and background part are visually exchanged according to the viewing direction.

In an embodiment of this specification, each of the first region and the second region may comprise a plurality of convexes. The widths of the first and second regions and the numbers of convexes of the first and second regions may be appropriately adjusted by considering the size of a targeted image or the logo.

In an embodiment of this specification, the first inclined side and the second inclined side are the straight line or the curved line.

In an embodiment of this specification, the first inclined side and the second inclined side are the straight line. This is illustrated in FIG. 15. The cross section of the pattern layer has a convex shape, and the cross section of the convex comprises a first region D1 comprising the first inclined side and a second region D2 comprising the second inclined side. The first inclined side and the second inclined side have straight shapes. An angle c3 between the first inclined side and the second inclined side may be 75 degrees to 105 degrees, or 80 degrees to 100 degrees. An angle c1 between the first inclined side and the ground and an angle c2 between the second inclined side and the ground are different from each other. For example, a combination of c1 and c2 may be 20 degrees/80 degrees, 10 degrees/70 degrees or 30 degrees/70 degrees.

In an embodiment of this specification, at least any one of the first inclined side and the second inclined side is the curved line. This is illustrated in FIGS. 16(a) and 16(b). The cross section of the pattern layer has a convex shape, and the cross section of the convex shape comprises a first region E1 comprising the first inclined side and a second region E2 comprising the second inclined side. At least one of the first inclined side and the second inclined side may have a curved shape. For example, both the first inclined side and the second inclined side may have curved shapes, the first inclined side may have a straight shape, and the second inclined side may have a curved shape. When the first inclined side has a straight shape and the second inclined side has a curved shape, the angle c1 may be greater than the angle c2. FIGS. 16(a) and 16(b) illustrate that the first inclined side has a straight shape, and the second inclined side has a curved shape. The angle between the inclined side having a curved shape and the ground may be calculated from an angle formed by a straight line and the ground when an arbitrary straight line is drawn from a point where the inclined side meets the ground to a point where the first inclined side meets the second inclined side. The second inclined side having the curved shape may have a different degree of curvature according to the height of the pattern layer, and the curved line may have a radius of curvature. The radius of curvature may be 10 times or less larger than the width (E1+E2) of the convex shape. FIG. 16(a) shows that the radius of curvature of the curve line is twice the width of the convex shape, and FIG. 16(b) shows that the radius of curvature of the curved line is one time the width of the convex shape. A ratio of a curvature portion E2 to the width (E1+E2) of the convex may be 90% or less. FIGS. 16(a) and 16(b) show that the ratio of the curvature portion E2 to the width (E1+E2) of the convex is 60%.

In an embodiment of this specification, the cross section of the convex shape may have a polygonal shape of a triangle or quadrangle.

In an embodiment of this specification, the cross section of the pattern layer may have a convex shape, and the cross section of the convex shape may have a quadrangular shape. This is illustrated in FIG. 17. The quadrangular shape may be a general quadrangular shape, and is not particularly limited as long as the inclination angles of the inclined sides are different from each other. The quadrangular shape may be a form remaining by partially cutting off a triangle. For example, the quadrangular shape may be a quadrangular trapezoid in which a pair of facing sides are parallel to each other, or a quadrangular shape in which a pair of facing sides parallel to each other do not exist. The convex-shaped cross section comprises a first region F1 comprising a first inclined side, a second region F2 comprising a second inclined side, and a third region F3 comprising a third inclined side. The third inclined side may or not be parallel to the ground. For example, when the quadrangular shape is trapezoidal, the third inclined side is parallel to the ground. At least one of the first inclined side to the third inclined side may have a curved shape and the details of the curved shape are as described above. The length of the sum of F1+F2+F3 may be defined as the width of the convex shape, and the details of the width are as described above.

In an embodiment of this specification, the pattern layer may comprise two or more convex shapes, and may further comprise a flat portion in a part or all between the convex shapes.

FIGS. 18(a) and 18(b) illustrate an example of the decoration member comprising the pattern layer according to an embodiment of this specification. A flat portion may be included between convexes of the pattern layer. The flat portion means a region where no convex exists. Except that the pattern layer further comprises a flat portion, the description of other components (D1, D2, c1, c2, c3, the first inclined side and the second inclined side) is as described above. On the other hand, the length of the sum of D1+D2+G1 is defined as a pitch of the pattern, which has a difference from the width of the pattern described above.

FIG. 19 exemplarily shows a pattern layer of a decoration member and a method of manufacturing the same according to an embodiment of this specification. The cross section of the pattern layer may have a convex shape, and the cross section of the convex shape may have a shape in which a specific region of a ABO1 triangle shape is removed. The method of determining the specific region to be removed is as follows. The contents of inclination angles c1 and c2 are the same as described above.

1) Set any point P1 on an AO1 segment that divides the AO1 segment at a ratio of L1:L2.

2) Set any point P2 on a BO1 segment that divides the BO1 segment at a ratio of m1:m2.

3) Set any point O2 on an AB segment that divides the AB segment at a ratio of n1:n2.

4) Set any point P3 on an O1O2 segment that divides a O2O1 segment at a ratio of o1:o2.

In this case, the ratios of L1:L2, m1:m2, n1:n2 and o1:o2 may be the same as or different from each other, and each independently 1:1000 to 1000:1.

5) Remove an area formed by a polygon of P1O1P2P3.

6) Set a shape formed by a polygon of ABP2P3P1 as a cross section of the convex.

The pattern layer may be modified in various forms by adjusting the ratios of L1:L2, m1:m2, n1:n2 and o1:o2. For example, when the L1 and m1 increase, the height of the pattern may increase, and when the o1 increases, the height of the concave formed on the convex may decrease, and a position of the lowest point of the concave formed in the convex may be adjusted close to either of the inclined sides of the convex by adjusting a ratio of n1.

FIGS. 20(a) and 20(b) exemplarily illustrate a pattern layer manufactured by the method of manufacturing the pattern layer of the decoration member of FIG. 19. When the ratios of L1:L2, m1:m2, and o1:o2 are all the same as each other, the cross section may have a trapezoidal shape. The heights ha and hb of the trapezoid may be varied by adjusting the ratio of L1:L2. For example, FIG. 20(a) shows a pattern layer manufactured when the ratio of L1:L2 is 1:1 and FIG. 20(b) shows a pattern layer manufactured when the ratio of L1:L2 is 2:1.

In an embodiment of this specification, the unit pattern is a unit prism pattern, the prism pattern has a ridge line in a first direction and is continuously arranged in a second direction perpendicular to the first direction, and the inorganic layer comprises a unit inorganic layer each provided on the unit prism pattern, and an average thickness of the unit inorganic layer provided on any one unit prism pattern may be different from the average thickness of the unit inorganic layer provided on another unit prism pattern arranged adjacent to the unit prism pattern.

The decoration member has an advantage that the gradation effect according to the interference phenomenon of light may be more variously changed by making the average thicknesses of the unit inorganic layers provided on the unit prism pattern different from each other. Further, the color is gradually changed depending on the change in thickness of the inorganic layer and the color is not abruptly changed, and as a result, a person viewing the decoration member may feel a natural color change. FIG. 1 illustrates one example of the decoration member.

In an embodiment of this specification, the average thickness of each unit inorganic layer provided on the unit prism pattern may increase or decrease toward the second direction.

In this specification, the "average thickness of the unit inorganic layer" may be an average value of thicknesses measured at two or more different points of the unit inorganic layer formed on the unit prism pattern.

In an embodiment of this specification, the cross section that appears when the straight line parallel to the first direction of the unit prism pattern is cut into the flat surface having a normal line comprises a first inclined side and a second inclined side having different inclination angles.

In an embodiment of this specification, the pattern layer may comprise a substrate on the surface other than the surface where the unit pattern is formed.

In an embodiment of this specification, a flat portion may be included in the other surface of the substrate.

According to an embodiment of this specification, a plastic substrate may be used as the substrate. Examples of the plastic substrate may comprise triacetyl cellulose (TAC); cyclo olefin copolymer (COP) such as norbornene derivatives; poly(methyl methacrylate (PMMA); polycarbonate (PC); polyethylene (PE); polypropylene (PP); polyvinyl alcohol (PVA); diacetyl cellulose (DAC); polyacrylate (Pac); poly ether sulfone (PES); polyetheretherketon (PEEK); polyphenylsulfone (PPS), polyetherimide (PEI); polyethylenenaphthatlate (PEN); polyethyleneterephtalate (PET); polyimide (PI); polysulfone (PSF); polyarylate (PAR) or an amorphous fluorine resin, etc., but are not limited thereto.

In an embodiment of this specification, a color dye may be further included inside or on at least one surface of the substrate.

In an embodiment of this specification, the color dye may comprise anthraquinone-based dyes, phthalocyanine-based dyes, thioindigo-based dyes, perinone-based dyes, isoxindigo-based dyes, methane-based dyes, monoazo-based dyes, and 1:2 metal complex-based dyes.

In an embodiment of this specification, when the substrate comprises a color dye therein, a scheme of adding a dye to the curable resin may be applied. When a color dye is further included in the lower portion of the substrate, a scheme of coating a layer containing the dye on the upper or lower portion of the substrate may be applied.

In an embodiment of this specification, materials of the substrate layer and the pattern layer may be the same as each other.

In an embodiment of this specification, the content of the color dye may be, for example, 0 to 50 wt %. The content of the color dye may determine the transmittance and haze range of the substrate and the decoration member, the transmittance may be, for example, 20% to 90%, and the haze may be, for example, 1% to 40%.

In an embodiment of this specification, the inorganic layer may be a single layer or a multiple layer comprising one or two or more types of materials selected from indium (In), titanium (Ti), and tin (Sn), silicon (Si), germanium (Ge), aluminum (Al), copper (Cu), nickel (Ni), vanadium (V), tungsten (W), tantalum (Ta), molybdenum (Mo), neodymium (Nb), iron (Fe), chromium (Cr), cobalt (Co), gold (Au), and silver (Ag) and one or two or more types of materials selected from the group consisting of an oxide, a nitride, or an oxynitride thereof and carbon and a carbon composite.

In an embodiment of this specification, the inorganic layer may comprise a light absorption layer and a light reflection layer sequentially provided from the pattern layer, or comprise a light reflection layer and a light absorption layer sequentially provided from the pattern layer.

In this specification, a "light absorption layer" and a "light reflection layer" are layers having relative physical properties, the light absorption layer may mean a layer having a higher light absorption than the light reflection layer and the light reflection layer may mean a layer having a higher light reflectivity than the light absorption layer.

Through FIG. 22, the light absorption layer and the light reflection layer will be described. In the decoration member of FIG. 22, each layer is laminated in the order of an $L_{i-1}$ layer, an $L_i$ layer, and an $L_{i+1}$ layer based on a light input direction, and an interface $I_i$ is positioned between the $L_{i-1}$ layer and the $L_i$ layer and an interface $I_{i+1}$ is located between the $L_i$ layer and the $L_{i+1}$ layer.

When irradiating light having a specific wavelength in a direction perpendicular to each layer so that thin film interference does not occur, the reflectance at the interface $I_i$ may be expressed by Equation 1 below.

$$\frac{[n_i(\lambda) - n_{i-1}(\lambda)]^2 + [k_i(\lambda) - k_{i-1}(\lambda)]^2}{[n_i(\lambda) + n_{i-1}(\lambda)]^2 + [k_i(\lambda) + k_{i-1}(\lambda)]^2} \qquad \text{[Equation 1]}$$

In Equation 1, $n_i(\lambda)$ denotes a refractive index according to a wavelength $\lambda$ of an i-th layer and $k_i(\lambda)$ denotes an extinction coefficient according to the wavelength $\lambda$ of the i-th layer. The extinction coefficient is a measure that may define how strongly a target material absorbs light at a specific wavelength, and the definition is described above.

By applying Equation 1 above, when a sum of the reflectances for each wavelength at the interface $I_i$ calculated at each wavelength is represented by $R_i$, the $R_i$ is represented by Equation 2 below.

$$R_i = \frac{\sum_{\lambda=380nm}^{\lambda=780nm} \frac{[n_i(\lambda) - n_{i-1}(\lambda)]^2 + [k_i(\lambda) - k_{i-1}(\lambda)]^2}{[n_i(\lambda) + n_{i-1}(\lambda)]^2 + [k_i(\lambda) + k_{i-1}(\lambda)]^2} \Delta\lambda}{\sum_{\lambda=380nm}^{\lambda=780nm} \Delta\lambda} \qquad \text{[Equation 2]}$$

In this case, when $R_i$ of $I_i$ is the largest among the interfaces of the laminate, the layer that is in contact with the interface $I_i$ and faces the interface $I_i$ and the direction in which light enters may be defined as a light reflection layer and the remaining layer may be defined as a light absorption layer. For example, in the laminate shown in FIG. 22, when the sum of the reflectances for each wavelength of the interface $I_{i+1}$ is the largest, a layer $L_{i+1}$ which is in contact with $I_{i+1}$ and faces the interface $I_{i+1}$ and the direction in which light enters may be defined as a light reflection layer, and the remaining layers $L_{i-1}$ layer and $L_i$ layer may be defined as a light absorption layer.

The light is absorbed on an incident path and a reflection path of the light in the light absorption layer and further, the light is reflected on each of the surface of the light absorption layer and the interface between the light absorption layer and the light reflection layer and two reflected light is constructively supplemented or destructively interfered. In this specification, the light reflected from the surface of the light absorption layer may be represented by surface reflected light and the light reflected from the interface between the light absorption layer and the light reflection layer may be represented by interface reflected light. FIG. 21 is a schematic diagram of such an operation principle. FIG. 21 illustrates a structure in which the substrate 101, the light reflection layer 201, and the light absorption layer 301 are stacked in this order, but the substrate is located below the light reflection layer, but is not essential.

The light reflected from the surface of the light absorption layer may be represented by surface reflected light and the light reflected from the interface between the light absorption layer and the light reflection layer may be represented by interface reflection light.

In an embodiment of this specification, a refractive index n of the light absorption layer at a wavelength of 400 nm may be preferably in the range of 0 to 8, and may be in the range of 0 to 7, in the range of 0.01 to 3, and in the range of 2 to 2.5. The refractive index n may be calculated as sin θa/sin θb (θa represents an angle of light incident on the surface of the light absorption layer and θb represents an angle of refraction of light inside the light absorption layer).

In an embodiment of this specification, the extinction coefficient k of the light absorption layer at the wavelength of 400 nm may be in the range of more than 0 and 4 or less and preferably in the range of 0.01 to 4 and in the range of 0.01 to 3.5, in the range of 0.01 to 3, and in the range of 0.1 to 1. The extinction coefficient k represents $-(1/4\pi I)(dI/dx)$ (where the extinction coefficient represents a path unit length dx in the light absorption layer, for example, a value acquired by multiplying a reduction fraction dI/I of light intensity per meter by 1/4p, where 1 represents the wavelength of light.

In an embodiment of this specification, the extinction coefficient k of the light absorption layer in the wavelength range of 380 to 780 nm may be preferably in the range of more than 0 and 4 or less and in the range of 0.01 to 4 and may be in the range of 0.01 to 3.5, in the range of 0.01 to 3, and in the range of 0.1 to 1. Since the extinction coefficient k is in the range in an entire visible light wavelength range of 400 nm or preferably 380 nm to 780 nm, the entire visible light wavelength range of 400 nm or preferably 380 nm to 780 nm may serve as the light absorption layer within a visible light range.

Even if having the same refractive index (n) value, when the extinction coefficient k value is 0 and the extinction coefficient k value is 0.01 at 380 to 780 nm, the difference may be $\Delta E^*ab = \sqrt{\{(\Delta L)^2 + (\Delta a)^2 + (\Delta b)^2\}} > 1$. For example, when simulating a case of irradiating D65 (solar spectrum) as a light source to the laminated structure of glass/aluminum/aluminum oxide/air layer, ΔE*ab when k value of the aluminum oxide is 0 and 0.01 is obtained as shown in Table 1 below. At this time, the thickness h1 of the aluminum layer is 120 nm, and the thickness h2 of the aluminum oxide layer is shown in Table 1 below. The k value was arbitrarily set to 0 and 0.01 for the simulation, and the n value was used as the aluminum value.

TABLE 1

| h2 [nm] | k = 0 | | | k = 0.01 | | | ΔE*ab |
|---|---|---|---|---|---|---|---|
| | L* | a* | b* | L* | a* | b* | |
| 40 | 6.63 | 1.75 | −1.25 | 85.18 | 2.09 | 0.03 | 1.96 |
| 60 | 9.83 | −4.02 | −8.30 | 87.86 | −4.06 | −9.01 | 2.10 |
| 80 | 5.60 | −1.87 | −2.58 | 94.44 | −2.05 | −2.86 | 1.20 |

In an embodiment of this specification, the light absorption layer may be constituted by a single layer or two layers or more of multiple layers. The light absorption layer may be made of a material having an extinction coefficient k at a wavelength of 380 to 780 nm, that is, a material having an extinction coefficient greater than 0 and 4 or less, preferably 0.01 to 4. In an embodiment of this specification, the light absorption layer is a single layer or a multiple layer comprising one or two or more types of materials selected from indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nb), iron (Fe), chromium (Cr), cobalt (Co), gold (Au), and silver (Ag) and one or two or more types of materials selected from the group consisting of an oxide, a nitride, or an oxynitride thereof and carbon and a carbon composite.

In an embodiment of this specification, the light absorption layer comprises silicon (Si) or germanium (Ge). The light absorption layer made of silicon (Si) or germanium (Ge) may have a refractive index n of 0 to 8 and 0 to 7 at a wavelength of 400 nm and an extinction coefficient k of greater than 0 and 4 or less, preferably 0.01 to 4, and 0.01 to 3 or 0.01 to 1.

In an embodiment of this specification, the light absorption layer may be made of a material having an extinction coefficient k at a wavelength of 400 nm, preferably 380 to 780 nm, for example, the light absorption layer/light reflection layer may be made of a material such as CuO/Cu, CuON/Cu, CuON/Al, AlON/Al, AlN/Al/AlON/Cu, AlN/Cu, or the like.

In an embodiment of this specification, the material of the light reflection layer is not particularly limited as long as the material is a material capable of reflecting light, but the light reflectance may be determined according to the material, and for example, the color is easily implemented at 50% or more. The light reflectance may be measured using an ellipsometer.

In an embodiment of this specification, the light reflection layer may be a metal layer, a metal oxynitride layer, or an inorganic layer. The light reflection layer may be constituted by a single layer or constituted by two layers or more of multiple layers.

As an example, the light reflection layer may be a single layer or multiple layers comprising one or two types or more of materials selected from the group consisting of indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nb), iron (Fe), chromium (Cr), cobalt (Co), gold (Au), and silver (Ag) and one or two types or more of materials of an oxide, a nitride, or an oxynitride thereof and carbon and a carbon composite.

In an embodiment of this specification, the light reflection layer may comprise two or more alloys selected from the above materials, oxides, nitrides or oxynitrides thereof. For example, the light reflection layer may comprise two or more alloys selected from the metals. More specifically, the light reflection layer may comprise molybdenum, aluminum or copper. According to yet another example, the light reflection layer is manufactured by using an ink comprising carbon or a carbon composite to implement a high resistance reflection layer. The carbon or carbon composite comprises carbon black, CNT, and the like. The ink comprising the carbon or carbon composite may comprise the above-described material or an oxide, nitride, or oxynitride thereof and comprise, for example, one or two or more types of oxides selected from the group consisting of indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nb), iron (Fe), chromium (Cr), cobalt (Co), gold (Au), and silver (Ag). A curing process may be additionally performed after printing the ink comprising the carbon or carbon composite.

In an embodiment of this specification, when the light reflection layer comprises two types or more of materials, two or more kinds of materials may be formed by one process, for example, a deposition or printing method, but a method for first forming the layer with one or more kinds of materials and then additionally forming the layer thereon with one or more kinds of materials may be used. For example, the layer is formed by depositing indium or tin and then the ink comprising the carbon is printed and then cured, thereby forming the light reflection layer. The ink may additionally comprise oxide such as titanium oxide or silicon oxide.

In an embodiment of this specification, the thickness of the light reflection layer may be determined according to a desired color in a final structure, and for example, may be 1 nm or more, preferably 25 nm or more, for example, 50 nm or more, and preferably 70 nm or more.

In an embodiment of this specification, the light absorption layer may exhibit various shapes by adjusting a deposition condition and the like when forming the light absorption layer.

In an embodiment of this specification, the decoration member may have the dichroism of color difference ΔE*ab>1.

In an embodiment of this specification, the decoration member may be a decoration film or a case of a mobile device.

In this specification, the method of applying the decoration member to portable electronic devices, electronic products, cosmetic containers, furniture, building materials, and the like is not particularly limited, and a known method known as a method of applying a decoration film in the art may be applied. The decoration member may further comprise an adhesive layer as necessary. In another example, the decoration member may be applied to portable electronic devices or electronic products by direct coating. In this case, a separate adhesive layer for attaching the decoration member to portable electronic devices or electronic products may not be required. In another example, the decoration member may be attached to portable electronic devices or electronic products through the adhesive layer. The adhesive layer may use an optically clear adhesive tape (OCA tape) or an adhesive resin. As the OCA tape or the adhesive resin, OCA tapes or adhesive resins known in the art may be applied without limitation. If necessary, a release liner for protecting the adhesive layer may be further provided.

Mode for Invention

Hereinafter, this specification will be described in detail with reference to Examples, but the scope of this specification is not limited by the following Examples.

EXAMPLES

Example 1

Hard molding was performed on the PET substrate to form at least two prism-shaped unit patterns continuously arranged. At this time, the shapes of respective prisms were the same, and both inclination angles of the triangle represented by the cross section of the prism were 20 degrees and 70 degrees, respectively, and the angle of the vertex was 90 degrees.

The unit pattern has a ridge line in a first direction and is continuously arranged in a second direction perpendicular to the first direction.

Thereafter, a silicon (Si) light absorption layer and an indium (In) light reflection layer were sequentially deposited on the unit pattern to form an inorganic layer (light absorption layer/light reflection layer lamination structure), thereby manufacturing a decoration member.

At this time, toward the unit patterns arranged in the second direction, the average thickness of the inorganic layer deposited on each unit pattern increased. The minimum value of the average thickness of the inorganic layer was 10 nm, and the maximum thickness of the inorganic layer was 20 nm.

The horizontal and vertical lengths of the prepared decoration member were 200 mm×300 mm. The color in which the prepared decoration member appears is shown in FIG. 23. In this case, the second direction is a direction indicated by an arrow in FIG. 23.

Example 2

The decoration member was prepared by the same method as Example 1 above except that the minimum value of the average thickness of the inorganic layer is 20 nm and the maximum thickness of the inorganic layer is 30 nm. The color in which the prepared decoration member appears is shown in FIG. 24. In this case, the second direction is a direction indicated by an arrow in FIG. 24.

Example 3

The decoration member was prepared by the same method as Example 1 above except that the minimum value of the average thickness of the inorganic layer is 80 nm and the maximum thickness of the inorganic layer is 90 nm. The color in which the prepared decoration member appears is shown in FIG. 25. In this case, the second direction is a direction indicated by an arrow in FIG. 24.

Example 4

The decoration member was prepared by the same method as Example 1 above except that the minimum value of the average thickness of the inorganic layer is 90 nm and the maximum thickness of the inorganic layer is 100 nm. The color in which the prepared decoration member appears is shown in FIG. 26. In this case, the second direction is a direction indicated by an arrow in FIG. 24.

The decoration members according to Examples 1 to 4 above comprise a pattern of an asymmetric structure and an area in which the thickness of the inorganic layer increases, thereby showing a gradation effect in which the color is gradually changed according to the position of the decoration member as illustrated in FIGS. 23 to 26.

The invention claimed is:

1. A decoration member comprising:
a pattern layer comprising two or more unit patterns; and
an inorganic layer formed on the pattern layer,
wherein the inorganic layer comprises a region in which a thickness t(x) of the inorganic layer formed on each unit pattern increases in a direction x in which the unit patterns are arranged.

2. The decoration member of claim 1, wherein the area where the thickness t(x) of the inorganic layer increases comprises at least one of: an area where the thickness gradually increases, an area where the thickness continuously increases, and an area where the thickness discontinuously increases.

3. The decoration member of claim 1, wherein the thickness t(x) of the inorganic layer is 10 nm or more and 300 nm or less.

4. The decoration member of claim 1, wherein a value calculated by Equation A below is 0.01 or more and 2 or less:

$$\frac{t1 - t0}{t1} \quad \text{[Equation A]}$$

in Equation A, t0 represents a minimum thickness of a region where the thickness t(x) of the inorganic layer increases and t1 represents a maximum thickness of a region where the thickness t(x) of the inorganic layer increases.

5. The decoration member of claim 1, wherein a difference between a minimum thickness t0 of the area where the thickness t(x) of the inorganic layer increases and a maximum thickness t1 of the area where the thickness t(x) of the inorganic layer increases is 1 nm or more and 30 nm or less.

6. The decoration member of claim 1, wherein the unit pattern comprises a structure having an asymmetric cross-section.

7. The decoration member of claim 6, wherein the cross section of the asymmetric structure comprises a first inclined side and a second inclined side having different inclination angles.

8. The decoration member of claim 7, wherein an angle formed by the first inclined side and the second inclined side is 80 to 100 degrees.

9. The decoration member of claim 7, wherein a difference in inclination angle between the first inclined side and the second inclined side is 30 to 70 degrees.

10. The decoration member of claim 1, wherein the unit pattern is a unit prism pattern,
the prism pattern has a ridge line in a first direction and is continuously arranged in a second direction perpendicular to the first direction,
the inorganic layer comprises a unit inorganic layer provided on each of unit prism pattern, and
an average thickness of the unit inorganic layer provided on any one unit prism pattern is different from the average thickness of the unit inorganic layer provided on another unit prism pattern arranged adjacent to the unit prism pattern.

11. The decoration member of claim 10, wherein the average thickness of each unit inorganic layer provided on the unit prism pattern increases or decreases toward the second direction.

12. The decoration member of claim 1, wherein a substrate is included in a surface other than a surface where the unit pattern of the pattern layer is formed.

13. The decoration member of claim 12, wherein a color dye is further included inside or on at least one surface of the substrate.

14. The decoration member of claim 1, wherein the inorganic layer is constituted by a single layer or multiple layers comprising one or two types of materials selected from the group consisting of: indium (In), titanium (Ti), tin (Sn), silicon (Si), germanium (Ge), aluminum (Al), copper (Cu), nickel (Ni), vanadium (V), tungsten (W), Tantalum (Ta), molybdenum (Mo), neodymium (Nb), iron (Fe), chromium (Cr), cobalt (Co), gold (Au), and silver (Ag) and one or two types of materials selected from the group consisting of an oxide, nitride, or an oxynitride thereof and carbon and a carbon composite.

15. The decoration member of claim 1, wherein the inorganic layer comprises a light absorption layer and a light reflection layer sequentially provided from the pattern layer or comprises the light reflection layer and the light absorption layer sequentially provided from the pattern layer.

16. The decoration member of claim 15, wherein the light absorption layer has a refractive index in the range of 0 to 8 at a wavelength of 400 nm.

17. The decoration member of claim 15, wherein the light absorption layer has an extinction coefficient of more than 0 and 4 or less at the wavelength of 400 nm.

18. The decoration member of claim 1, wherein the decoration member exhibits dichroism of $\Delta E * ab > 1$.

19. The decoration member of claim 1, wherein the decoration member is a decoration film or a case of a mobile device.

* * * * *